(12) United States Patent
Miya et al.

(10) Patent No.: US 7,608,152 B2
(45) Date of Patent: Oct. 27, 2009

(54) SUBSTRATE PROCESSING APPARATUS AND METHOD

(75) Inventors: Katsuhiko Miya, Kyoto (JP); Koji Ando, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 790 days.

(21) Appl. No.: 11/130,585

(22) Filed: May 17, 2005

(65) Prior Publication Data

US 2005/0276921 A1 Dec. 15, 2005

(30) Foreign Application Priority Data

Jun. 14, 2004 (JP) ............................. 2004-175730
Dec. 15, 2004 (JP) ............................. 2004-362178

(51) Int. Cl.
*B08B 3/02* (2006.01)
(52) U.S. Cl. ......................... 134/33; 134/182; 134/183; 134/902
(58) Field of Classification Search ................. 134/182, 134/183, 902, 184, 198
See application file for complete search history.

(56) References Cited

U.S. PATENT DOCUMENTS

| | | | | |
|---|---|---|---|---|
| 4,021,278 A | * | 5/1977 | Hood et al. ..................... | 438/8 |
| 4,705,951 A | * | 11/1987 | Layman et al. ........ | 250/442.11 |
| 5,472,502 A | * | 12/1995 | Batchelder .................... | 118/52 |
| 5,979,475 A | * | 11/1999 | Satoh et al. .................. | 134/140 |
| 6,273,104 B1 | * | 8/2001 | Shinbara et al. ............ | 134/25.4 |
| 6,431,190 B1 | * | 8/2002 | Oka et al. ..................... | 134/148 |
| 6,446,643 B2 | * | 9/2002 | Curtis et al. ................ | 134/25.4 |
| 6,832,616 B2 | * | 12/2004 | Miyazaki .................... | 134/98.1 |
| 6,857,838 B2 | * | 2/2005 | Kuroda .................. | 414/331.01 |
| 6,939,807 B2 | * | 9/2005 | Yun et al. .................... | 438/704 |
| 6,958,113 B2 | * | 10/2005 | Mizohata et al. ........ | 204/224 R |

(Continued)

FOREIGN PATENT DOCUMENTS

JP 8-678368 * 3/1996

(Continued)

OTHER PUBLICATIONS

Office Action issued Jun. 6, 2008 for the corresponding Chinese Patent Application No. 200510076190.6.

(Continued)

*Primary Examiner*—Frankie L Stinson
(74) *Attorney, Agent, or Firm*—Ostrolenk Faber LLP

(57) ABSTRACT

In the vicinity of a rim portion of a spin base 5, a plurality of supports 7 which abut on a bottom rim portion of a substrate W and support the substrate W are formed projecting toward above from the spin base 5. The substrate W is supported horizontally by the plurality of supports 7, with a predetermined distance ensured from the spin base 5 which opposes the bottom surface of the substrate W. Into the space which is created between the top surface of the substrate W and an opposing surface 9a of an atmosphere blocker plate 9, inert gas is ejected from a plurality of gas ejection outlets 9b which are formed in the opposing surface 9a. The inert gas thus supplied to the top surface of the substrate W presses the substrate W against the supports 7 and the substrate W is held at the spin base 5.

15 Claims, 12 Drawing Sheets

U.S. PATENT DOCUMENTS

| | | | |
|---|---|---|---|
| 2003/0196683 A1* | 10/2003 | Izumi et al. ............... | 134/2 |
| 2003/0226577 A1* | 12/2003 | Orll et al. ................. | 134/1.3 |
| 2004/0065540 A1 | 4/2004 | Mayer et al. | |
| 2004/0226655 A1* | 11/2004 | Kajino et al. ........... | 156/345.11 |
| 2005/0178401 A1* | 8/2005 | Boyers ..................... | 134/1.3 |
| 2006/0021636 A1 | 2/2006 | Miya | |
| 2007/0141951 A1 | 6/2007 | Naoki et al. | |
| 2008/0035610 A1 | 2/2008 | Miya et al. | |

FOREIGN PATENT DOCUMENTS

| | | | |
|---|---|---|---|
| JP | 8-141478 | | 6/1996 |
| JP | 11-176795 | | 7/1999 |
| JP | 2003-109935 | * | 4/2003 |
| JP | 2003-203891 | | 7/2003 |
| JP | 2003-264168 | * | 9/2003 |
| WO | WO 00/42637 | * | 7/2000 |

OTHER PUBLICATIONS

U.S. Office Action issued in corresponding U.S. Appl. No. 11/154,363.

* cited by examiner

F I G. 1 1
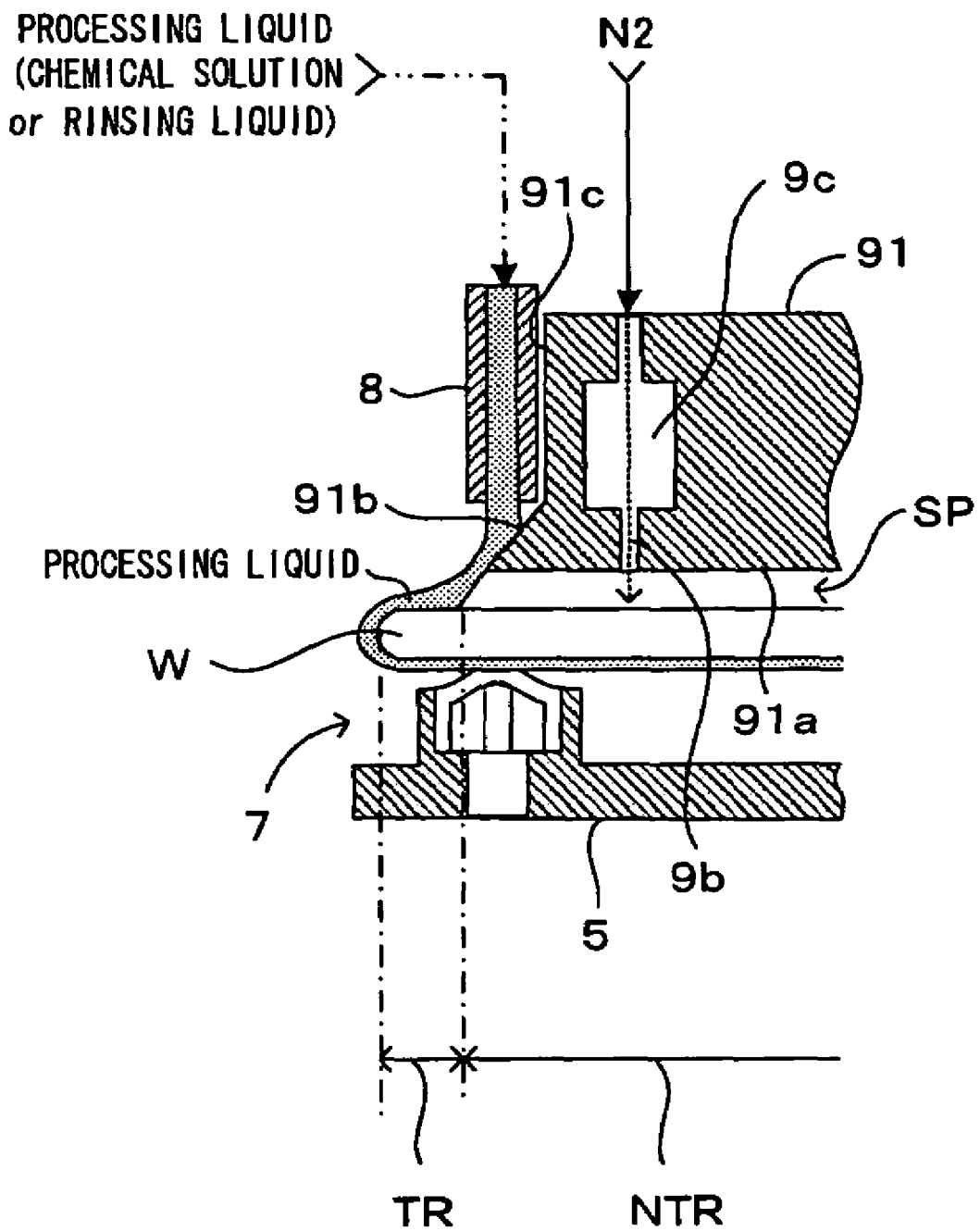

SUBSTRATE PROCESSING APPARATUS AND METHOD

CROSS REFERENCE TO RELATED APPLICATION

The disclosure of Japanese Patent Applications enumerated below including specification, drawings and claims is incorporated herein by reference in its entirety:
No. 2004-175730 filed Jun. 14, 2004; and
No. 2004-362178 filed Dec. 15, 2004.

BACKGROUND OF THE INVENTION

1. Field of the Invention

The invention relates to a substrate processing apparatus which performs processing such as cleaning on various types of substrates such as semiconductor wafers, glass substrates for photomask, glass substrates for liquid crystal display, glass substrates for plasma display and optical disk substrates by supplying a processing liquid to these substrates.

2. Description of the Related Art

Conventional substrate processing apparatuses of this type include a substrate processing apparatus in which a substrate such as a semiconductor wafer is supported on a disk-shaped rotary base member which is supported such that the rotary base member can freely rotate about a vertical axis, a processing liquid such as a chemical solution is supplied to the top and the bottom surfaces of the substrate while rotating the substrate, and the substrate is consequently processed (Japanese Patent Application Laid-Open Gazette No. H11-176795). In the substrate processing apparatus described in Japanese Patent Application Laid-Open Gazette No. H11-176795, a plurality of, three for instance, holding members such as chuck pins, which are disposed in the vicinity of the outer edge of the rotary base member, position and support a substrate. This realizes transmission of rotation force from the rotary base member to the substrate, and rotates the substrate while restricting the substrate in the horizontal direction. As the substrate rotates while the processing liquid is supplied to the center of the top and the bottom surfaces of the substrate, the processing liquid spreads toward outside to the substrate, and the top and the bottom surfaces of the substrate are accordingly processed. The processing liquid splashing at the rim of the substrate may hit and jump at an anti-splashing cup or the like which is disposed around the rotary base member and adhere again to the substrate. To prevent this, a blocking member is disposed near the top surface of the substrate, thereby restricting the space on the top side of the substrate, and inert gas such as nitrogen gas is introduced to thus restricted space. Meanwhile, similarly as for the bottom side of the substrate, inert gas is introduced to the space which is created between the rotary base member which serves as the blocking member and the bottom surface of the substrate, for prevention of re-adhering of the processing liquid to the bottom surface of the substrate.

SUMMARY OF THE INVENTION

However, the approach that the chuck pins are disposed as a holding member near the outer edge of a substrate and the substrate is positioned in the horizontal direction and supported may cause a processing liquid moving outward in the diameter direction on the surface of the substrate during processing to directly hit and jump at the chuck pins and to adhere to the surface of the substrate again without getting discharged to outside the substrate. In addition, as the rotary base member rotates, the chuck pins disposed upward to the rotary base member disturbs air flows around the edge surface of the substrate. In consequence, the mist-like processing liquid splashing around during processing may suck in and enter the space which is created between the substrate and the blocking member (or the rotary base member) and adhere to the surface of the substrate again. Further, while a chuck for the substrate may be opened and closed (i.e., the substrate may be released) during processing for the purpose of processing a holding section on the substrate where the chuck pins holds the substrate, in this case, the processing liquid moving outward in the diameter direction over the substrate in particular can easily splash at the chuck pins.

The present invention has been made in light of the problems above. Accordingly, the object of the invention is to effectively prevent re-adhering of a processing liquid to the surfaces of a substrate in a substrate processing apparatus and method in which a predetermined processing is performed on the substrate by supplying the processing liquid to the substrate while rotating the substrate.

According to a first aspect of the present invention, there is provided a substrate processing apparatus which performs predetermined processing by supplying a processing liquid to a substrate while rotating said substrate, comprising: a rotary member which is structured to rotate freely about a vertical axis; a rotating element which rotates said rotary member; a support element which is disposed upward to said rotary member and which comprises at least three supporting members which abut on a bottom surface of said substrate to thereby support said substrate with a distance from said rotary member; and a pressing element which presses said substrate against said supporting members by supplying gas to a top surface of said substrate and accordingly makes said rotary member hold said substrate.

According to a second aspect of the present invention, there is provided a substrate processing method in which predetermined processing is performed by supplying a processing liquid to a substrate while rotating said substrate, said method comprising steps of: making at least three supporting members which are disposed upward to a rotary member abut on a bottom surface of said substrate to thereby support said substrate with a distance from said rotary member; pressing said substrate against said supporting members by supplying gas to a top surface of said substrate and accordingly makes said rotary member hold said substrate; and rotating said rotary member about a vertical axis to thereby rotating said substrate.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 11 is a partial cross sectional view of the substrate processing apparatus shown in FIG. 10.

DETAILED DESCRIPTION OF THE PREFERRED EMBODIMENTS

First Embodiment

Figure 1:
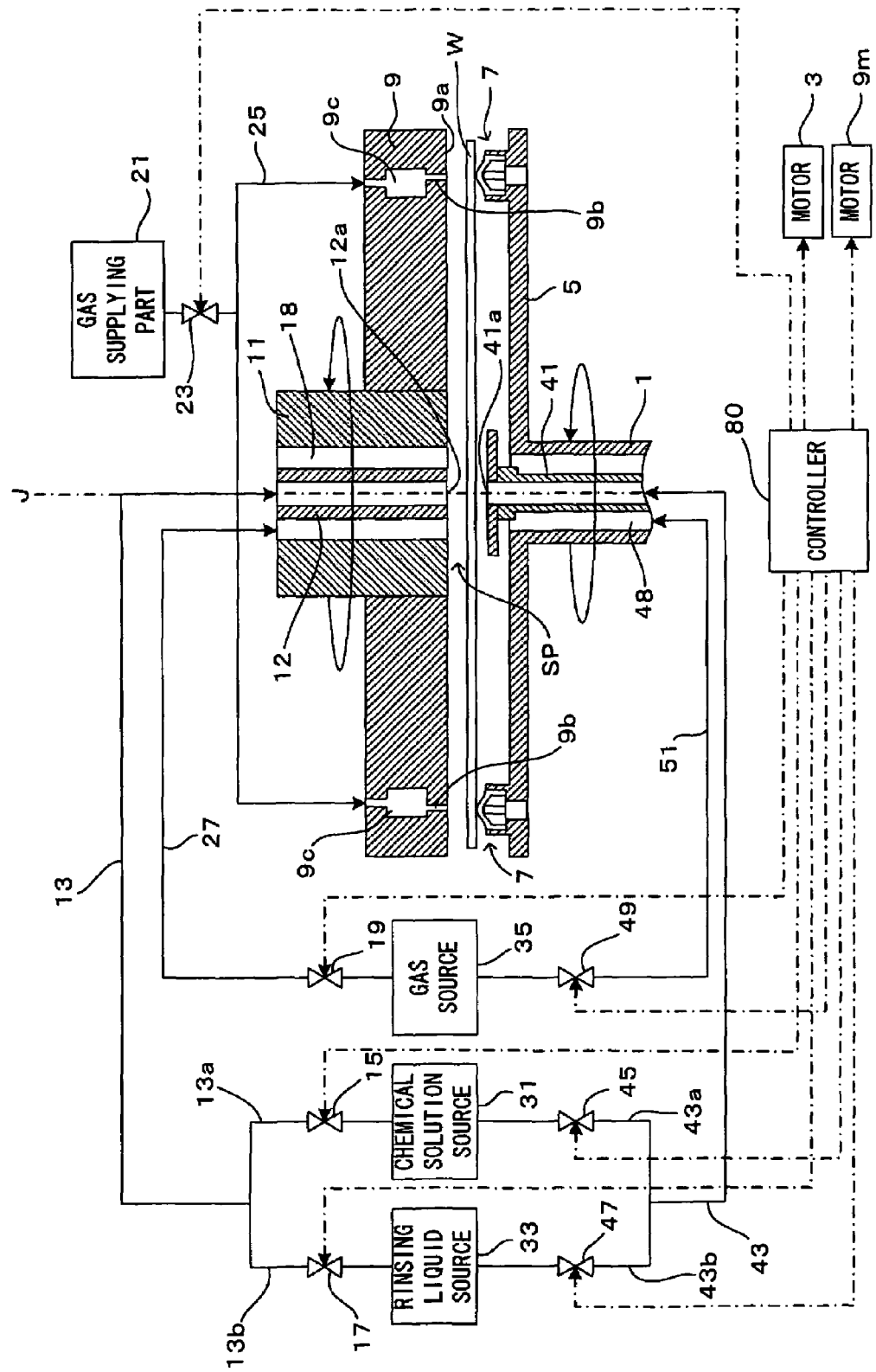
FIG. 1 is a drawing which shows a first embodiment of a substrate processing apparatus according to the present invention.

FIG. 1 is a drawing which shows a first embodiment of a substrate processing apparatus according to the present invention. This substrate processing apparatus is an apparatus in which a chemical solution of a chemical substance, an organic solvent or the like and a rinsing liquid which may be pure water or DIW (hereinafter also referred to as "processing liquid(s)") are supplied to the surfaces of a substrate W such as a semiconductor wafer, and spin drying is executed after chemical processing and rinsing of the substrate W. In this substrate processing apparatus, the bottom surface of the substrate W can be processed while supplying the processing liquid to the bottom surface of the substrate W, and after supplied to the bottom surface of the substrate W, the processing liquid moves from the bottom surface of the substrate W to the edge surface of the substrate W and circles over to the top surface (a device-seating surface) of the substrate W, so that the top rim portion of the substrate W is processed (bevel processing). Further, when the processing liquid is supplied to the top surface of the substrate W, the top surface of the substrate W can be processed.

In this substrate processing apparatus, a hollow rotation shaft 1 is linked to a rotation shaft of a motor 3, and when driven by the motor 3, the rotation shaft 1 rotates about a vertical axis J. A spin base 5 is linked to and integrated with the top end of the rotation shaft 1 by a fastening component such as a screw. Hence, when driven by the motor 3, the spin base 5 rotates about the vertical axis J. In the vicinity of a rim portion of the spin base 5, there are a plurality of supports 7 which abut on a bottom rim portion of the substrate W and support the substrate W, and these supports 7 are disposed projecting upward from the spin base 5. The substrate W is supported horizontally by the supports 7, with a predetermined distance from the spin base 5. In this embodiment, the spin base 5 thus corresponds to the "rotary member" of the present invention.

Figure 2:
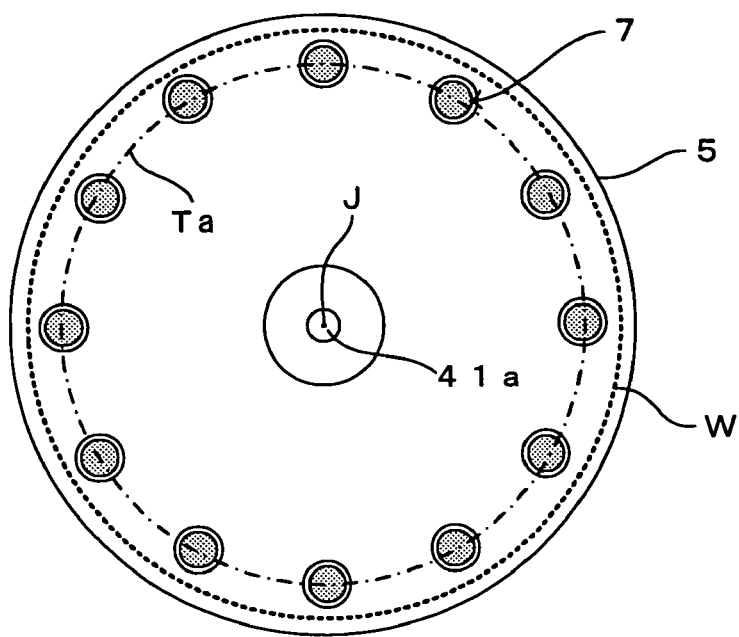
FIG. 2 is a plan view of the spin base as it is viewed from above.

FIG. 2 is a plan view of the spin base 5 as it is viewed from above. There is an opening in a central portion of the spin base 5, and the plurality of supports 7 (twelve supports in this embodiment) are disposed near the rim of the spin base 5. The twelve supports 7 are each apart by 30 degrees about the vertical axis J in a radial arrangement. While at least three supports 7 are needed to support the substrate W horizontally, considering processing of the sections where the supports 7 abut on the bottom surface of the substrate W, it is desirable that the supports 7 are capable of freely abutting on and moving away from the bottom surface of the substrate W and that the supports 7 move away from the bottom surface of the substrate W at least once during processing. Processing of the bottom surface of the substrate W including the sections where the supports 7 abut on the bottom surface of the substrate W necessitates at least four supports 7. If twenty four supports 7, the double the supports 7 used in this embodiment, are disposed, the structure will be more stable without causing any problem. The structure and an operation of the supports 7 will be described in detail later.

The substrate processing apparatus further comprises, as shown in FIG. 1, an atmosphere blocker plate 9 which is disposed opposing the spin base 5 and blocks the atmosphere above the top surface of the substrate W and a gas supplying part 21 (which corresponds to the "gas supplying part" of the present invention) which supplies inert gas such as nitrogen gas into the space SP which is created between the atmosphere blocker plate 9 and the top surface of the substrate W. As the gas supplying part 21 supplies the inert gas into the space SP toward the top surface of the substrate W, the substrate W is pressed against the supports 7 and the spin base 5 holds the substrate W. A condition for rotating the substrate W which is pressed against the supports 7 and held at the spin base 5 will be described in detail later.

The atmosphere blocker plate 9 is attached to a bottom end of a hollow cylindrical support shaft 11 such that the atmosphere blocker plate 9 can rotate with the support shaft 11 integrally. A block drive mechanism (not shown) which has a motor 9m is linked to the support shaft 11, and therefore, when the motor 9m of the block drive mechanism is driven, the atmosphere blocker plate 9 together with the support shaft 11 rotates about the vertical axis J which is coaxial with the rotation shaft of the spin base 5. A controller 80 controls and synchronizes the motor 9m to the motor 3, and accordingly drives the atmosphere blocker plate 9 into rotation in the same direction and at the same rotation speed as the spin base 5. Further, by activating an ascend/descend drive actuator (such as an air cylinder) of the block drive mechanism, the controller 80 moves the atmosphere blocker plate 9 closer to or away from the spin base 5.

Figure 3:
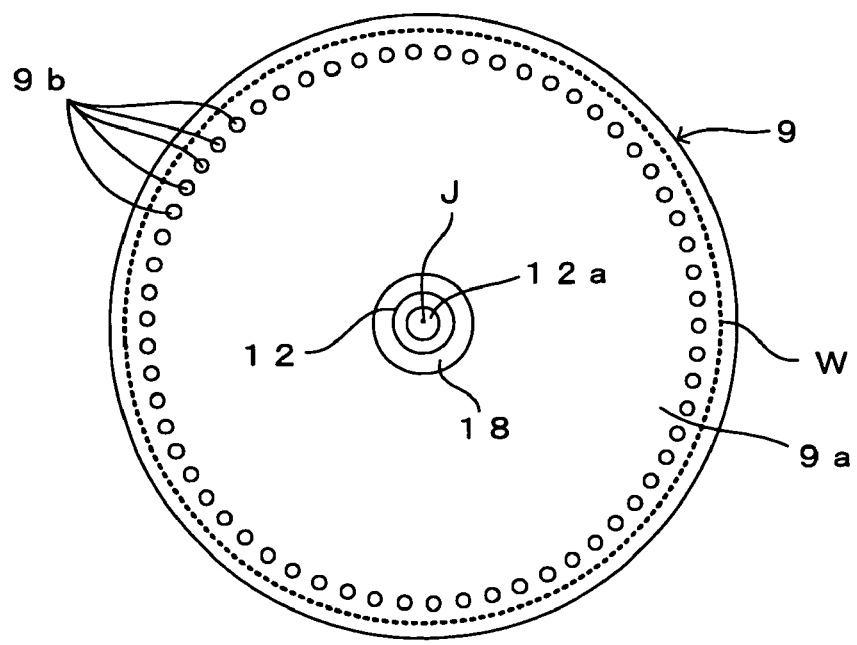
FIG. 3 is a bottom view of the atmosphere blocker plate.

FIG. 3 is a bottom view of the atmosphere blocker plate 9. The atmosphere blocker plate 9 is slightly larger than the diameter of the substrate W and has an opening at the center. The atmosphere blocker plate 9 is located above the spin base 5, and the under surface (bottom surface) of the atmosphere blocker plate 9 is an opposing surface 9a facing the top surface of the substrate W. There are a plurality of gas ejection outlets 9b in this opposing surface 9a. The plurality of gas ejection outlets 9b are arranged at such positions which correspond to the supports 7 formed on the spin base 5. To be more specific, the plurality of gas ejection outlets 9b are arranged on a rotation track Ta of the supports 7 (FIG. 2) such that the gas ejection outlets 9b are equidistant from each other along the circumference about the vertical axis J. These gas ejection outlets 9b are communicated with gas distributing spaces 9c respectively which are inside the atmosphere blocker plate 9. The gas ejection outlets are not necessarily limited to a plurality of openings, but instead may be a single opening such as an opening which is formed like a complete ring and concentric about the vertical axis J. However, the plurality of gas ejection outlets 9b are more advantageous in attaining a uniform gas ejection pressure. In this embodiment, the atmosphere blocker plate 9 thus corresponds to the "platy member" of the present invention and the gas ejection outlets 9b thus corresponds to the "gas ejection outlets" of the present invention.

The description is continued referring back to FIG. 1. To supply gas to the gas distributing space 9c which is created inside the atmosphere blocker plate 9, the gas distributing space 9c is communicated with the gas supplying part 21 through a pipe 25. An on-off valve 23 which is opened and closed under control of the controller 80 is placed in the pipe 25. When the controller 80 opens the on-off valve 23, the inert gas such as nitrogen gas is supplied from the gas supplying part 21 into the gas distributing space 9c and ejected at the plurality of gas ejection outlets 9b toward the top surface of the substrate W. The gas ejection outlets 9b are formed in the opposing surface 9a of the atmosphere blocker plate 9 so as to be on the rotation track Ta of the supports 7, for ejection of the inert gas approximately along the vertical direction.

As the inert gas is ejected uniformly at the plurality of gas ejection outlets 9b, the substrate W is evenly pressed against the respective supports 7 which are disposed projecting upward from the spin base 5. The substrate W is consequently supported horizontally at the spin base 5. Since the inert gas is supplied directly to the sections in the top surface of the substrate W where the supports 7 abut on the bottom surface of the substrate W, it is possible to securely hold the substrate W at the spin base 5 in an efficient manner using the minimum necessary amount of gas supply. The supply of the inert gas at the plurality of gas ejection outlets 9b is not limited only to supply onto the rotation track Ta of the supports 7, and the inert gas may be supplied toward an inner side or an outer side along the diameter direction relative to the rotation track Ta of the supports 7.

An upper clean nozzle 12 is disposed coaxially to the opening at the center of the atmosphere blocker plate 9 and to the hollow section of the support shaft 11 so that at a nozzle outlet 12a at the bottom end of the upper clean nozzle 12, the processing liquid such as a chemical solution and a rinsing liquid can be supplied to an area which is near the rotation center of the top surface of the substrate W which is pressed against and held at the spin base 5. The upper clean nozzle 12 is connected to a pipe 13. The pipe 13 branches off at the base end. One branch pipe 13a is connected to a chemical solution source 31, while the other branch pipe 13b is connected to a rinsing liquid source 33. On-off valves 15 and 17 are placed respectively in the branch pipes 13a and 13b, making it possible to switch between supply of a chemical solution and supply of a rinsing liquid and thus selectively supply the chemical solution or the rinsing liquid to the top surface of the substrate W from the upper clean nozzle 12 as the on-off valves 15 and 17 open and close under control of the controller 80.

The gap between the inner wall surface of the hollow section of the support shaft 11 and the outer wall surface of the upper clean nozzle 12 serves as a gas supply path 18. The gas supply path 18 is communicated with a gas source 35 via a pipe 27 in which an on-off valve 19 is placed. After chemical processing or rinsing using the upper clean nozzle 12, as the on-off valve 19 opens and closes under control of the controller 80, gas such as clean air and inert gas is supplied via the gas supply path 18 into the space SP which is created between the top surface of the substrate W and the opposing surface 9a of the atmosphere blocker plate 9, and the substrate W is accordingly dried.

A lower clean nozzle 41 corresponding to the "bottom-side processing liquid supplier" of the present invention is disposed coaxially to the hollow section of the rotation shaft 1, to thereby supply at a nozzle outlet 41a, which is at the top end of the lower clean nozzle 41, the processing liquid to an area which is near the rotation center of the bottom surface of the substrate W. The lower clean nozzle 41 is connected to a pipe 43. The pipe 43 branches off at the base end. One branch pipe 43a is connected to the chemical solution source 31, while the other branch pipe 43b is connected to the rinsing liquid source 33. On-off valves 45 and 47 are placed respectively in the branch pipes 43a and 43b, making it possible to switch between supply of the chemical solution and supply of the rinsing liquid and thus selectively to supply the chemical solution or the rinsing liquid to the bottom surface of the substrate W from the lower clean nozzle 41 as the on-off valves 45 and 47 open and close under control of the controller 80.

The gap between the inner wall surface of the rotation shaft 1 and the outer wall surface of the lower clean nozzle 41 serves as a gas supply path 48. The gas supply path 48 is communicated with the gas source 35 via a pipe 51 in which an on-off valve 49 is placed, and therefore, it is possible to supply gas such as clean air and inert gas via the gas supply path 48 into the space between the bottom surface of the substrate W and the opposing surface of the spin base 5 as the on-off valve 49 opens and closes under control of the controller 80.

Figure 4:
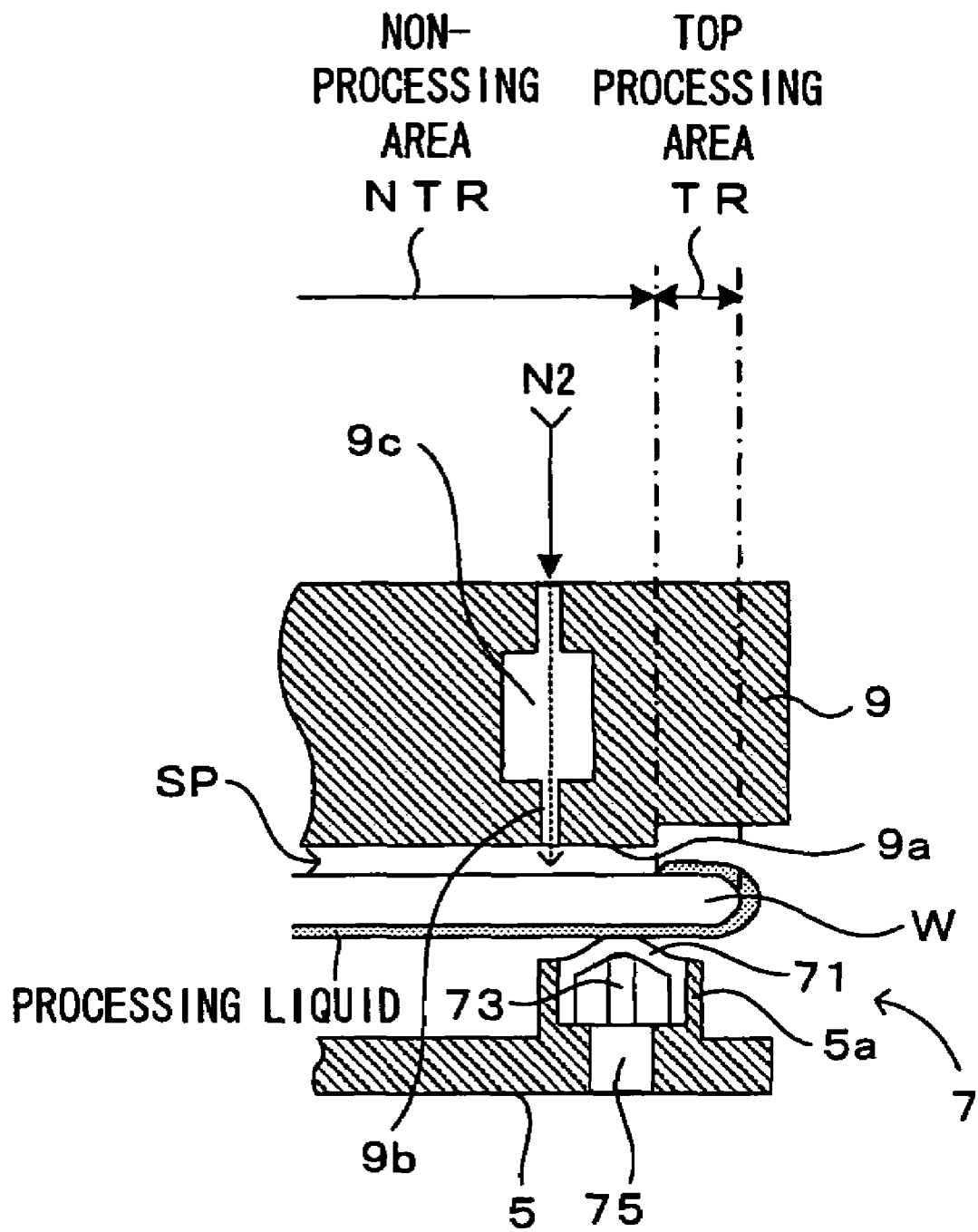
FIG. 4 is a partial cross sectional view showing the structure of the supports.

The structure and an operation of the supports 7 will now be described. FIG. 4 is a partial cross sectional view showing the structure of the supports. Since all the supports 7 have the identical structures, the structure of only one support 7 will be described with reference to FIG. 4. As shown in FIG. 4, a rim portion of a top surface of the spin base 5 is protruded upward to form a protrusion 5a which has a form of a hollow circular cylinder opening upward. The support 7 is disposed inside the protrusion 5a and comprises a film member 71, a movable rod 73, and a driver 75. The film member 71 has a form of a hollow circular cylinder opening downward and is made of a flexible material. The film member 71 is disposed inside the protrusion 5a in such a manner that the outer circumference of the film member 71 is in close contact with the inner circumference of the protrusion 5a. The movable rod 73 is disposed inside the film member 71 and is supported to freely move up and down to abut on and move away from the bottom surface of the top center of the film member 71. The driver 75 such as a motor is linked to the movable rod 73 via a drive link section not shown and moves the movable rod 73 upward and downward. The driver 75 is not limited to a motor. Actuators in general such as air cylinders may be used instead.

In the support 7 having the above structure, as the driver 75, when receiving a drive signal from the controller 80, drives the movable rod 73 upward via the drive link portion, the top end of the movable rod 73 abuts on the bottom surface of the top center of the film member 71 and pushes up the top center of the film member 71. As this occurs, the top surface of the film member 71 projects beyond the top end of the protrusion 5a of the spin base 5. Hence, with all (or at least three) of the film members 71 of the plurality of supports 7 projected in this fashion, the substrate W is supported horizontally with a distance (which may be about 1 mm) from the top end of the protrusions 5a of the spin base 5 while maintaining the contact between the film members 71 and the bottom surface of the substrate W (FIG. 4).

On the contrary, when the driver 75 drives the movable rod 73 downward, the top end of the movable rod 73 moves away from the bottom surface of the top center of the film member 71, and the top surface of the film member 71 retracts back to the same plane as the top end of the protrusion 5a of the spin base 5 on its own because of its flexibility. Thus, among the projecting film members 71 of the plurality of supports 7, when some except for at least three are moved down, the descended film members 71 move away from the bottom surface of the substrate W. In addition, such film members 71 are made of resin which is flexible and anti-corrosive against the processing liquid. A fluororesin such as PCTFE (polychlorotrifluoroethylene) is preferably used as the film members 71. In this embodiment, the film members 71 thus correspond to the "supporting members" of the present invention and the driver 75 thus corresponds to the "driver" of the present invention.

A description will now be given on the relationship between a location of a top processing area TR, the supply positions of the inert gas ejected out at the gas ejection outlets 9b which are formed in the opposing surface 9a of the atmosphere blocker plate 9, and the locations of the supports 7. The top processing area TR is an area which is processed with the processing liquid which circles over to the top rim portion of the substrate W during processing (bevel processing) of the top rim portion of the substrate W with the processing liquid supplied to the bottom surface of the substrate W and circling over to the top surface of the substrate W via the edge surface of the substrate W. Ejected substantially vertically at the gas ejection outlets 9b toward the top surface of the substrate W, the inert gas reaches a non-processing area NTR which is on the inner side relative to the top processing area TR which is processed with the processing liquid which circles over to the top rim portion. Meanwhile, the supports 7 are disposed in the rim portion of the spin base 5 so as to abut on and support the sections in the bottom surface of the substrate W corresponding to the non-processing area NTR to which the inert gas is supplied. This structure prevents entry of the processing liquid to the non-processing area NTR and ensures that the processing liquid circles over the edge surface in a uniform width along the direction of the diameter of the substrate W. As for the rim of the opposing surface 9a of the atmosphere blocker plate 9, the opposing surface steps back as viewed from the top such that the step-back section is matched with the top processing area TR and circling over of the processing liquid is not disturbed.

Figure 5:
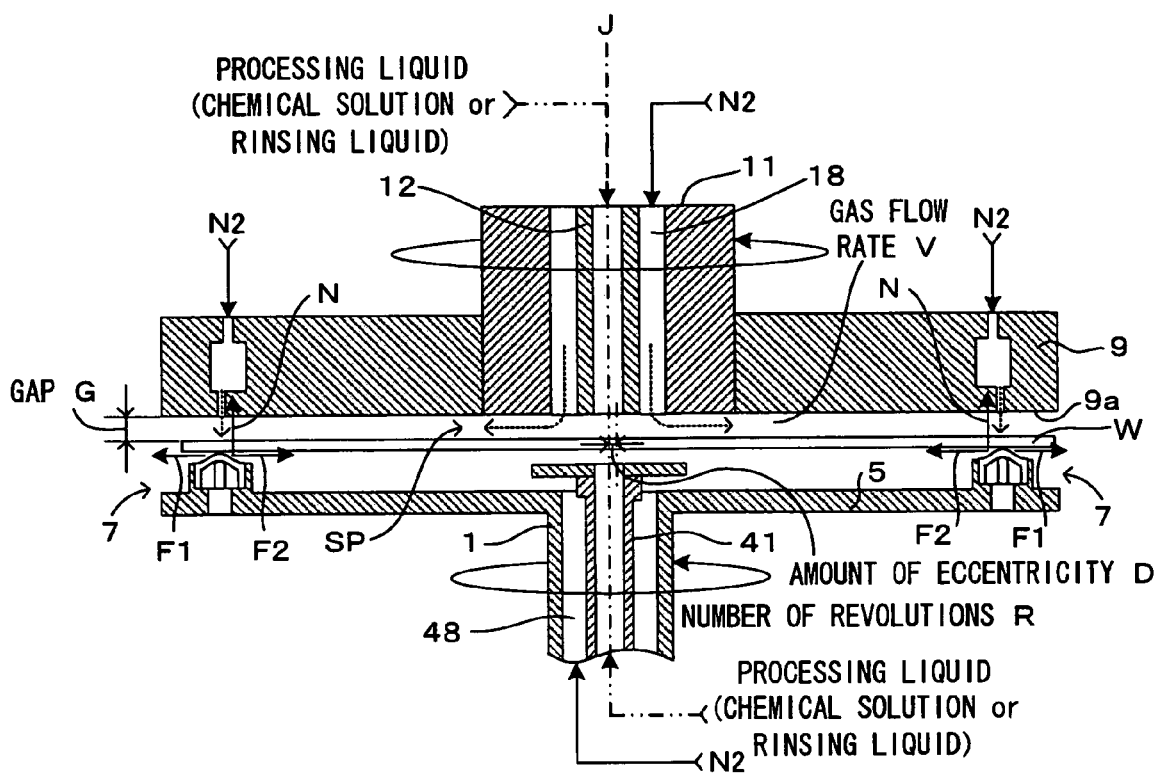
FIG. 5 is a drawing to describe a condition for holding the substrate at the spin base.

A condition for rotating the substrate W while pressing the substrate W against the supports 7 and holding the substrate W at the spin base 5 will now be described with reference to FIG. 5. In the case of the approach which requires pressing the substrate W against the supports 7 which abut on the bottom surface of the substrate W, the inert gas is supplied into the space SP which is created between the top surface of the substrate W and the opposing surface 9a of the atmosphere blocker plate 9, the internal pressure inside the space SP consequently rises, and the substrate W is pressed against the supports 7. In short, as the substrate W rotates at a high speed though there is no holding member such as a chuck pin which abuts on the outer edge of the substrate W and holds the substrate W, the substrate W could fly out sideways to the outer side along the diameter direction. This is because higher the rotation speed of the substrate W becomes, more easily the inert gas supplied into the space SP is discharged to outside the substrate so that the internal pressure inside the space SP becomes lower, and because the larger the number of revolutions of the substrate W becomes, the larger the centrifugal force which acts upon the substrate W becomes (in proportion to the square of the number of revolutions).

Hence, for the purpose of rotating the substrate W while maintaining the substrate W pressed against the supports 7 and held at the spin base 5, it is necessary to set a condition for the apparatus within a range which satisfies the inequality below:

$$F1 < F2$$

where the symbol F1 denotes a centrifugal force acting upon the substrate W and the symbol F2 denotes a friction force developing between the bottom surface of the substrate W and the supports 7. While the centrifugal force F1 upon the substrate W acts outwardly along the diameter direction, the friction force F2 developing between the bottom surface of the substrate W and the supports 7 acts inwardly along the diameter direction, i.e., to the opposite to the centrifugal force F1. The centrifugal force is generally expressed as $mr\omega^2$ (m: mass, r: the radius from the center of rotation to a mass point (m), $\omega$: angular velocity). Parameters associated with the apparatus which determine the centrifugal force F1 acting upon the substrate W are the number of revolutions R of the spin base 5, a distance D along the diameter direction from the vertical axis J of the spin base 5 to the physical center of the substrate W (hereinafter referred to as the "amount of eccentricity"), and the mass of the substrate W. Meanwhile, the friction force F2 developing between the bottom surface of the substrate W and the supports 7 is determined by the product $\mu N$ of normal force N acting upon the substrate W and a friction factor (coefficient of static friction) $\mu$ between the substrate W and the supports 7.

Noting this, through experiments, the inventors of the present invention obtained the threshold values of the following five control factors regarding the apparatus so as to satisfy the inequality above. That is, the inventors obtained the threshold values of five parameters: (1) the number of revolutions R of the spin base 5; (2) the amount of eccentricity D; (3) a gas flow rate V; (4) a distance G between the top surface of the substrate W and the opposing surface 9a of the atmosphere blocker plate 9 (hereinafter referred to as a "gap"); and (5) the planar displacement between the substrate W and the atmosphere blocker plate 9, and the degree of parallelism between the substrate W and the atmosphere blocker plate 9. The gas flow rate V is indicative of the total flow rate of the inert gas supplied to the space SP, i.e., the flow rate of the gas which is supplied to the top surface of the substrate W from the gas supply path 18 and the gas ejection outlets 9b. The planar displacement between the substrate W and the atmosphere blocker plate 9 is indicative of the width over which the surface of the substrate W and the opposing surface 9a swing in the vertical direction as the substrate W and the atmosphere blocker plate 9 both rotate about the vertical axis J. The degree of parallelism between the substrate W and the atmosphere blocker plate 9 refers to the degree of parallelism between the top surface of the substrate W and the opposing surface 9a.

In the experiments, the inventors used silicon substrates having the diameter of 300 mm, ensuring that the substrate material determining the mass of the substrate W and the friction factor $\mu$ was approximately constant. On the other hand, the friction factor $\mu$ is largely different depending upon the material of the supports 7. The friction factor $\mu$ is relatively large when the material of the supports 7 which abut on the bottom surface of the substrate W is SiC, glassy carbon, alumina, etc., whereas the friction factor $\mu$ is relatively small when the material contains a fluororesin. A fluororesin material may be PCTFE (polychlorotrifluoroethylene), PVDF (polyvinylidenefluoride), PEEK (polyetheretherketone), PVC (polyvinylchloride), etc. Meanwhile, when Kalrez (registered trademark) or perfluoroelastomer which is used for an O-ring as a chemically resistant elastic material is used, the friction factor $\mu$ exhibits a value between those of the group containing SiC, glassy carbon, alumina, etc and those of the group containing PCTFE, PVDF, PEEK, PVC, etc.

Calculating the threshold values of the respective parameters regarding the apparatus using these three groups of materials, the inventors obtained the results which are shown in Table 1 through Table 3. Table 1 shows the result which was obtained when SiC, glassy carbon, alumina or the like was used as the material of the supports 7. Table 2 shows the result which was obtained when PCTFE, PVDF, PEEK, PVC or the like was used as the material of the supports 7. Table 3 shows the result which was obtained when Kalrez (registered trademark) or perfluoroelastomer was used as the material of the supports 7. When these ranges of conditions shown in Table 1 through Table 3 are met, it is possible to perform stable processing without causing slipping of the substrate W on the supports 7.

TABLE 1

| | |
|---|---|
| (1) The number of revolutions R (rpm) | $\leq 3000$ |
| (2) The amount of eccentricity D (mm) | $\leq 2$ |
| (3) The gas flow rate V (L/min) | $\geq 30$ |
| (4) The gap G (mm) | $\leq 2$ |
| (5) The planar displacement between the substrate and the blocker plate and the degree of parallelism between the substrate and the blocker plate (mm) | $\leq 1$ |

TABLE 2

| | |
|---|---|
| (1) The number of revolutions R (rpm) | $\leq 2000$ |
| (2) The amount of eccentricity D (mm) | $\leq 1.5$ |
| (3) The gas flow rate V (L/min) | $\geq 50$ |
| (4) The gap G (mm) | $\leq 1$ |
| (5) The planar displacement between the substrate and the blocker plate and the degree of parallelism between the substrate and the blocker plate (mm) | $\leq 0.5$ |

TABLE 3

| | |
|---|---|
| (1) The number of revolutions R (rpm) | $\leq 2500$ |
| (2) The amount of eccentricity D (mm) | $\leq 1.5$ to 2 |
| (3) The gas flow rate V (L/min) | $\geq 40$ |
| (4) The gap G (mm) | $\leq 1.5$ |
| (5) The planar displacement between the substrate and the blocker plate and the degree of parallelism between the substrate and the blocker plate (mm) | $\leq 0.5$ to 1 |

As shown in Table 1 through Table 3, the smaller the friction factor $\mu$ between the substrate W and the supports 7 is, the smaller the number of revolutions R needs be and the larger the internal pressure inside the space SP must become by increasing the gas flow rate V and reducing the gap G This is because as the number of revolutions R increases, the centrifugal force F1 increases, which facilitates discharging of the inert gas out from the space SP, reduces the internal pressure inside the space SP, i.e., the normal force N acting upon the substrate W, and decreases the friction force F2. In this embodiment, it is possible to finely adjust the gas flow rate using a flow rate controller such as a mass flow controller of course, and to finely adjust the gap between the atmosphere blocker plate 9 and the substrate W by means of pulse control of the ascend/descend drive actuator of the block drive mechanism in the units of 0.01 mm, and thus, the precise control of the press-holding condition enhances the versatility of the apparatus.

An operation of the substrate processing apparatus having the structure above will now be described. To be more specific, processing of the bottom surface of the substrate W and the top rim portion of the substrate W with the processing liquid supplied to the bottom surface of the substrate W and circling over to the top surface of the substrate W via the edge surface of the substrate W will now be described. In this substrate processing apparatus, a substrate transportation robot not shown transports an unprocessed substrate W to the substrate processing apparatus, and as the substrate W is mounted at its back surface on the supports 7 with the device-seating surface of the substrate W facing up, chemical processing, rinsing and drying are executed while the controller 80 controls the respective portions of the apparatus in the manner below. While the substrate transportation robot transports the substrate W, the atmosphere blocker plate 9, the support shaft 11 and the upper clean nozzle 12 retract as one unit above the spin base 5 and stay away from the spin base 5.

Once the substrate W is mounted on the supports 7 in this manner, the atmosphere blocker plate 9, the support shaft 11 and the upper clean nozzle 12 move down as one unit, and the atmosphere blocker plate 9 is accordingly located close to the substrate W. With the on-off valve 23 open, the inert gas from the gas supplying part 21 is ejected at the gas ejection outlets 9b which are formed in the opposing surface 9a of the atmosphere blocker plate 9 and the inert gas is supplied toward a central portion of the top surface of the substrate W via the gas supply path 18. This increases the internal pressure inside the space SP which is created between the opposing surface 9a of the atmosphere blocker plate 9 and the top surface of the substrate W, whereby the substrate W is pressed against the supports 7 which abut on the bottom surface of the substrate W and held at the spin base 5. In addition, the top surface of the substrate W is covered with the opposing surface 9a of the atmosphere blocker plate 9 which has come very close to the top surface of the substrate W. In this state, as the inert gas is ejected evenly at the plurality of gas ejection outlets 9b, the substrate W is pressed evenly against the supports 7 and held horizontally.

Following this, the motor 3 drives the spin base 5 and the substrate W into rotations as one unit. The substrate W thus pressed against the supports 7 rotates together with the spin base 5, as it is supported by the supports 7 owing to the friction force which develops between the supports 7 and the substrate W. At this stage, the motor 9m of the block drive mechanism not shown turns on, thereby rotating the atmosphere blocker plate 9 about the vertical axis J in the same direction and at the approximately same number of revolutions as the spin base 5. This prevents the rotations from creating excessive air flows between the substrate W and the atmosphere blocker plate 9. In this embodiment, the motor 3 and the motor 9m form the "rotating element" of the present invention.

As the substrate W starts rotating, the controller 80 opens the on-off valve 45, and the chemical solution is supplied at the nozzle outlet 41a of the lower clean nozzle 41 to a central portion of the bottom surface of the substrate W from the chemical solution source 31. The chemical solution supplied to the central portion of the bottom surface of the substrate W spreads throughout the bottom surface due to the centrifugal force created by the rotations of the substrate W, thereby achieving the chemical processing of the entire bottom surface of the substrate W. As the respective supports 7 move away at least once from the bottom surface of the substrate W during the chemical processing, the chemical solution circles even into those sections where the supports 7 and the substrate W contact and these contact sections are processed. To this end, the twelve supports 7 may move away one at a time for example, or to the extent that at least three supports 7 remain abutting on the bottom surface of the substrate W, two or more supports 7 may move away at a time. The supply of the inert gas from the gas supply path 18 opposes against the pressure of ejection of the chemical solution at the nozzle outlet 41*a* of the lower clean nozzle 41, in the central portion of the bottom surface of the substrate W.

While the chemical solution moving outwardly along the diameter direction of the substrate W via the bottom surface of the substrate W splashes to outside the substrate W except for the chemical solution which circles onto the top surface of the substrate W, since this embodiment does not use a holding member such as a chuck pin which holds the substrate W at the outer edge of the substrate W, the chemical solution which moves outwardly along the diameter direction of the substrate W will not jump back onto the surface of the substrate. Further, the absence of a factor which disturbs air flows near the outer edge of the substrate reduces blowing of the mist of the processing liquid toward the surface of the substrate. This prevents jumping back of the chemical solution onto the non-processing area NTR (a region on the inner side relative to the top processing area TR) in the top surface of the substrate W, and hence, corrosion of the non-processing area NTR (which is a device area in the case of a semiconductor wafer for instance). In addition, as blowing of the mist of the processing liquid is prevented, it is possible to suppress adhering of particles to the surface of the substrate.

A portion of the chemical solution supplied to the central portion of the bottom surface of the substrate W flows from the central portion to the rim of the substrate W, and circles over the edge surface of the substrate W and reaches the top rim portion of the substrate W. The top rim portion of the substrate W is thus thoroughly processed as the top processing area TR. As described above, since this embodiment does not use a holding member such as a chuck pin which holds the substrate W at the outer edge of the substrate W, the amount of the circling processing liquid does not become nonuniform. Hence, uneven processing which results from holding the substrate W at the outer edge of the substrate W is prevented.

After the chemical processing for a predetermined period of time, while the substrate W and the atmosphere blocker plate 9 still rotate, the controller 80 closes the on-off valve 45 and the supply of the chemical solution from the chemical solution source 31 is accordingly stopped, and the on-off valve 47 is then opened. As a result, the rinsing liquid (such as pure water, DIW and the like) is supplied to the central portion of the bottom surface of the substrate W at the nozzle outlet 41*a* of the lower clean nozzle 41. In this state, rinsing is performed in which the rinsing liquid supplied to the central portion of the bottom surface of the substrate W spreads throughout the bottom surface of the substrate W and washes away the chemical solution adhering to the substrate W. Further, the rinsing liquid supplied to the central portion of the bottom surface of the substrate W circles over the edge surface of the substrate W and washes away all of the chemical solution adhering to the top processing area TR of the substrate W. The chemical solution which exist in the bottom surface, the edge surface and the top rim portion of the substrate W after the chemical processing is washed away in this manner.

After rinsing for a predetermined period of time, the controller 80 closes the on-off valve 47 and the rinsing completes.

Next, the controller 80 rotates the motor 3 and the motor 9*m* of the block drive mechanism at a high speed, so that the substrate W and the atmosphere blocker plate 9 accelerate their rotations and the liquid components adhering to the surfaces of the substrate W and the atmosphere blocker plate 9 are drained off owing to the centrifugal force. During this drying, in addition to the supply of the inert gas into the space SP which is created between the top surface of the substrate W and the opposing surface 9*a* of the atmosphere blocker plate 9, the controller 80 opens the on-off valve 49, thereby introducing the inert gas into the space between the bottom surface of the substrate W and the opposing surface of the spin base 5 at a predetermined flow rate from the gas supply path 48. In consequence, the space around the substrate W is quickly substituted with the inert gas, which prevents contamination of the substrate W with the chemical atmosphere which remains in the space. Further, unwanted oxide films will not grow on the top and the bottom surfaces of the substrate W.

After the drying, the controller 80 stops the motor 3, thereby stopping the rotations of the substrate W, and stops the motor 9*m* of the block drive mechanism, thereby stopping the rotations of the atmosphere blocker plate 9. The on-off valves 19 and 23 are thereafter closed and the supply of the gas into the space SP is stopped, and the substrate W is released from pressing and holding. The atmosphere blocker plate 9 then moves toward above, and the substrate transportation robot unloads the processed substrate W.

As described above, in this embodiment, the substrate W is supported with a distance from the spin base 5 by the supports 7 which abut on the bottom surface of the substrate W, and the inert gas supplied to the top surface of the substrate W presses the substrate W against the supports 7 and the substrate W is held at the spin base 5. Owing to the friction force which develops between the supports 7 and the substrate W, the substrate W as it is supported by the supports 7 rotates together with the spin base 5. As the substrate W is held in this manner, it is not necessary to use a holding member such as a chuck pin which contacts the outer circumferential edge of the substrate W and holds the substrate W. Hence, the processing liquid which moves outward in the diameter direction on the surface of the substrate W as the substrate W rotates can never directly contact a holding member such as a chuck pin and jump back onto the surface of the substrate. Further, the absence of a factor which disturbs air flows near the outer edge of the substrate reduces sucking in of the mist-like processing liquid toward the surface of the substrate. This effectively prevents re-adhering of the processing liquid to the surface of the substrate.

In addition, since the supports 7 abut on and support the bottom surface of the substrate W and the substrate is held as the inert gas is supplied to the top surface of the substrate W, it is possible to ensure that the processing liquid circles over to the top rim portion (top processing area) TR of the substrate W in a uniform amount, without disturbing the circling of the processing liquid over to the top rim portion TR of the substrate W. Further, since the inert gas is supplied to the non-processing area NTR of the substrate W which is located on the inner side relative to the top processing area TR of the substrate W, entry of the chemical solution to the non-processing area NTR is prevented, ensuring that the processing liquid circles from the edge surface over a uniform width along the direction of the diameter of the substrate W.

Further, since the supports 7 can abut on and move away from the bottom surface of the substrate W and each support 7 moves away from the bottom surface of the substrate W at least once during processing while supplying the processing liquid to the bottom surface of the substrate W, the processing liquid circles even onto the sections where the supports 7 abut on the bottom surface of the substrate W and the entire bottom surface of the substrate W is processed.

Second Embodiment

Figure 6:
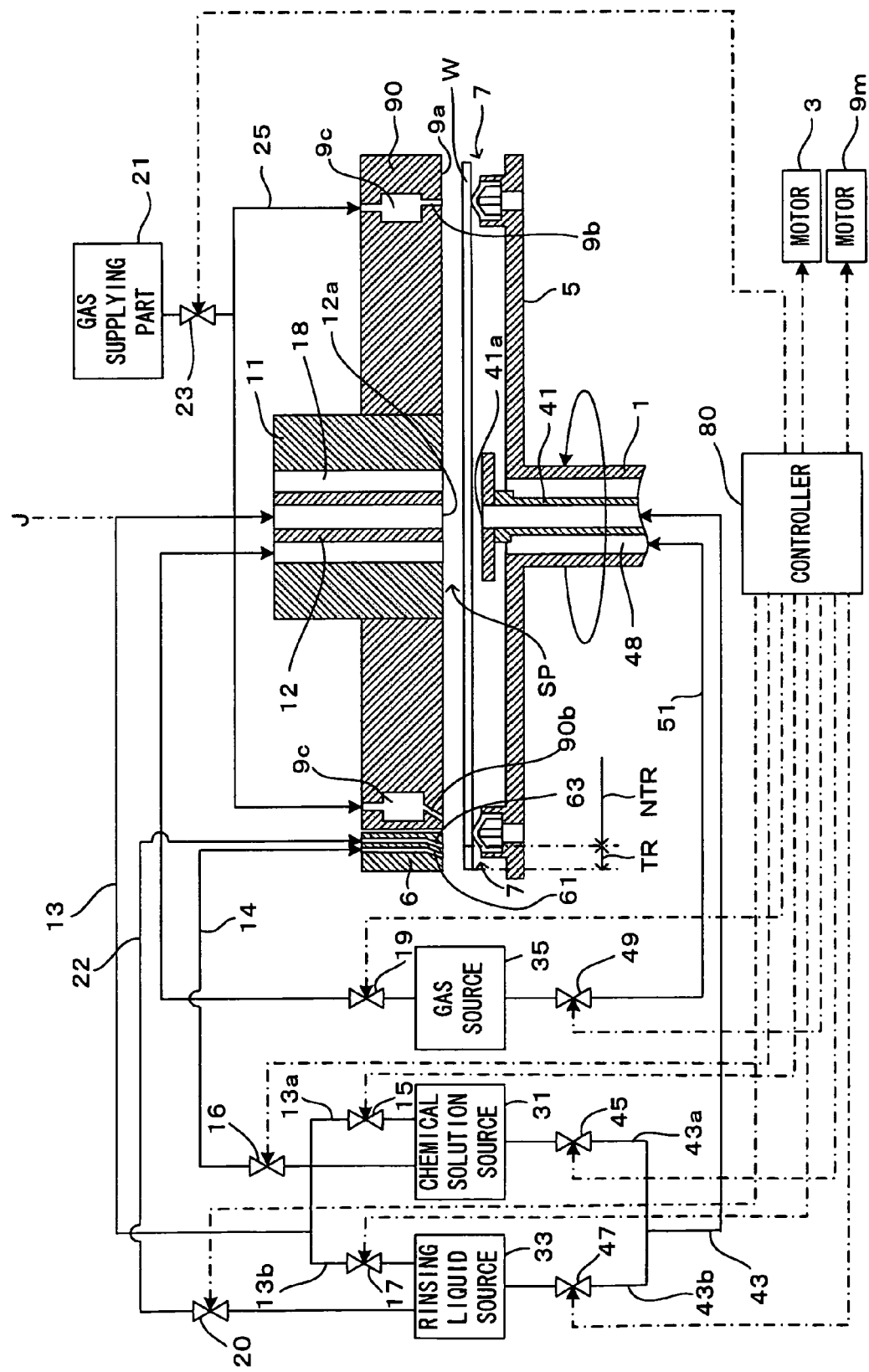
FIG. 6 is a drawing which shows a second embodiment of the substrate processing apparatus according to the present invention.
Figure 7:
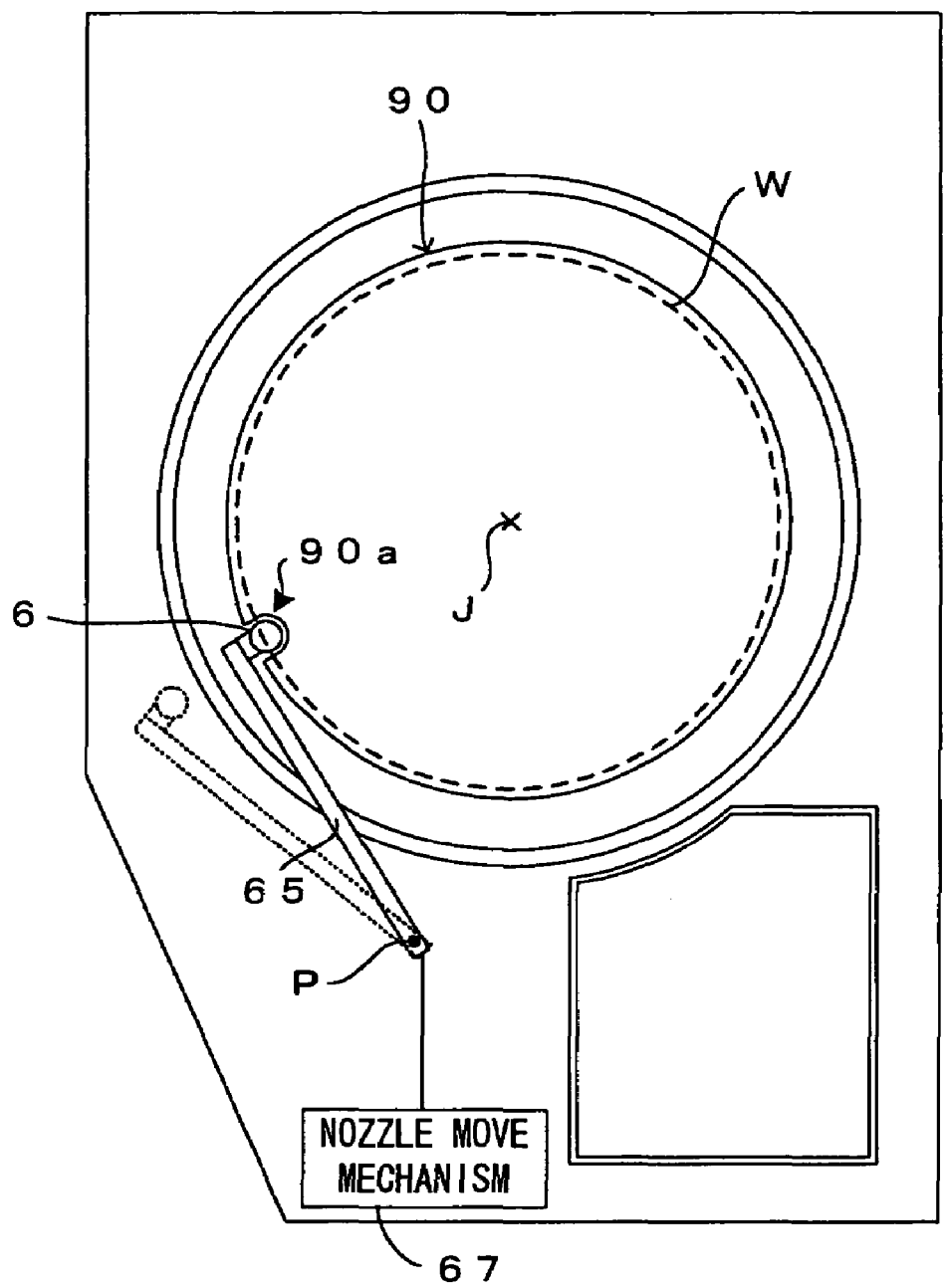
FIG. 7 is a plan view of the substrate processing apparatus which is shown in FIG. 6.

FIG. 6 is a drawing which shows a second embodiment of the substrate processing apparatus according to the present invention. FIG. 7 is a plan view of the substrate processing apparatus which is shown in FIG. 6. A major difference of the second embodiment from the first embodiment is that a processing liquid nozzle 6 is additionally disposed at which the processing liquid is supplied to the top rim portion of the substrate W and that because of the processing liquid nozzle 6 which is additionally disposed, the structure of the atmosphere blocker plate 90 is modified partially. The second embodiment is otherwise basically similar in structure to the first embodiment. Hence, as for a condition for rotating the substrate W while pressing the substrate W against the supports 7 and holding the substrate W at the spin base 5, when the parameter range described in relation to the first embodiment are met, stable processing is realized without causing slipping of the substrate W. In the following, the same structures will be denoted at the same reference symbols but will not be described, and the characteristics of the second embodiment will be described with a primary focus on differences.

In this embodiment, the top rim portion of the substrate W is processed with the processing liquid which is supplied at the processing liquid nozzle 6 which is disposed facing the top surface of the substrate W, not with the processing liquid which circles over to the top surface of the substrate W via the edge surface of the substrate W after supplied to the bottom surface of the substrate W. Disposed to the atmosphere blocker plate 9 above the spin base 5, the processing liquid nozzle 6 is capable of supplying the processing liquid to the top rim portion of the substrate W. That is, a chemical solution pipe 61 and a rinsing liquid pipe 63 are disposed to the inside of the processing liquid nozzle 6 so that a chemical solution and a rinsing liquid can be supplied from the bottom ends of the respective pipes 61 and 63 to the top rim portion of the substrate W. The chemical solution pipe 61 is connected with the chemical solution source 31 via a pipe 14, while the rinsing liquid pipe 63 is connected with the rinsing liquid source 33 via a pipe 22. On-off valves 16 and 20 are placed respectively in the pipes 14 and 22, and therefore, as the controller 80 controls the on-off valves 16 and 20, the flow rates of the chemical solution and the rinsing liquid fed to the processing liquid nozzle 6 are adjusted.

The processing liquid nozzle 6 is fixed to the top end of one arm 65 (FIG. 7). On the other hand, a nozzle move mechanism 67 is linked with the base end of the arm 65. As the nozzle move mechanism 67 is activated in response to a control command from the controller 80, the arm 65 pivots about the core of rotations P. Hence, the processing liquid nozzle 6 is capable of moving between an opposed position (the position denoted at the solid line in FIG. 7) which is opposed against the substrate W and at which the processing liquid is supplied to the top rim portion of the substrate W and a retract position (the position denoted at the broken line in FIG. 7) which is off to the side from a supply position. In this embodiment, the processing liquid nozzle 6 thus corresponds to the "top-side processing liquid supplier" of the present invention.

Figure 8:
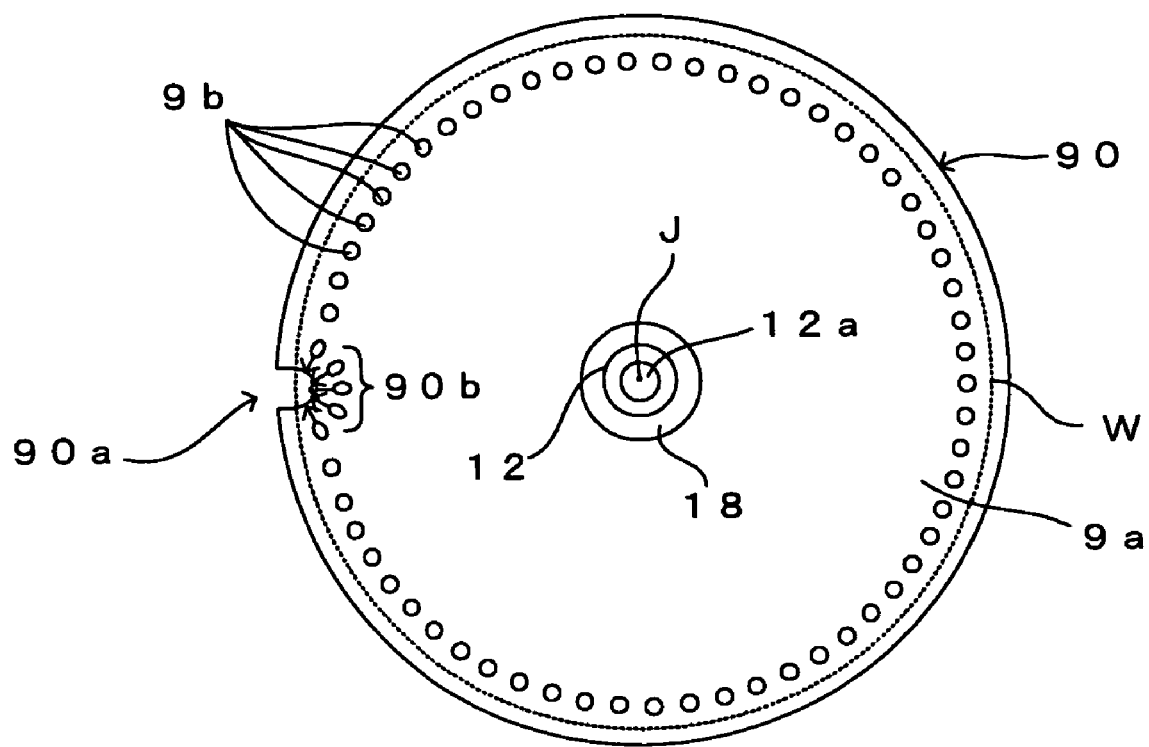
FIG. 8 is a bottom view of the atmosphere blocker plate of the substrate processing apparatus which is shown in FIG. 6.

FIG. 8 is a bottom view of the atmosphere blocker plate 90 of the substrate processing apparatus which is shown in FIG. 6. A difference of the atmosphere blocker plate 90 from the atmosphere blocker plate 9 of the substrate processing apparatus according to the first embodiment is that the atmosphere blocker plate 90 comprises a dent 90a which is a local recess in the brim of the atmosphere blocker plate 90 toward the center and that the gas ejection outlets 90b which are around the dent 90a are formed inclined downward and outward so that the inert gas is ejected downward and outward to the top surface of the substrate W. This permits the processing liquid nozzle 6 slip into the dent 90a and get located at an opposed position facing the top rim portion (top processing area) TR of the substrate W. So as to cover the top surface of the substrate W over a wide range with the atmosphere blocker plate 90, the dent 90a and the processing liquid nozzle 6 have minimum necessary sizes which are necessary to supply the processing liquid to the top rim portion TR of the substrate W. Further, ejection of the inert gas downward and outward at the gas ejection outlets 90b prevents the processing liquid from entering the non-processing area NTR (a region on the inner side relative to the top processing area TR) in the top surface of the substrate W when the processing liquid nozzle 6 is at the opposed position, and hence, the chemical atmosphere from entering the space SP which is created between the top surface of the substrate W and the atmosphere blocker plate 90 when the processing liquid nozzle 6 is at the retract position. The other structure is basically the same as that of the atmosphere blocker plate 9 of the substrate processing apparatus according to the first embodiment, and therefore, will not be described.

Figure 9:
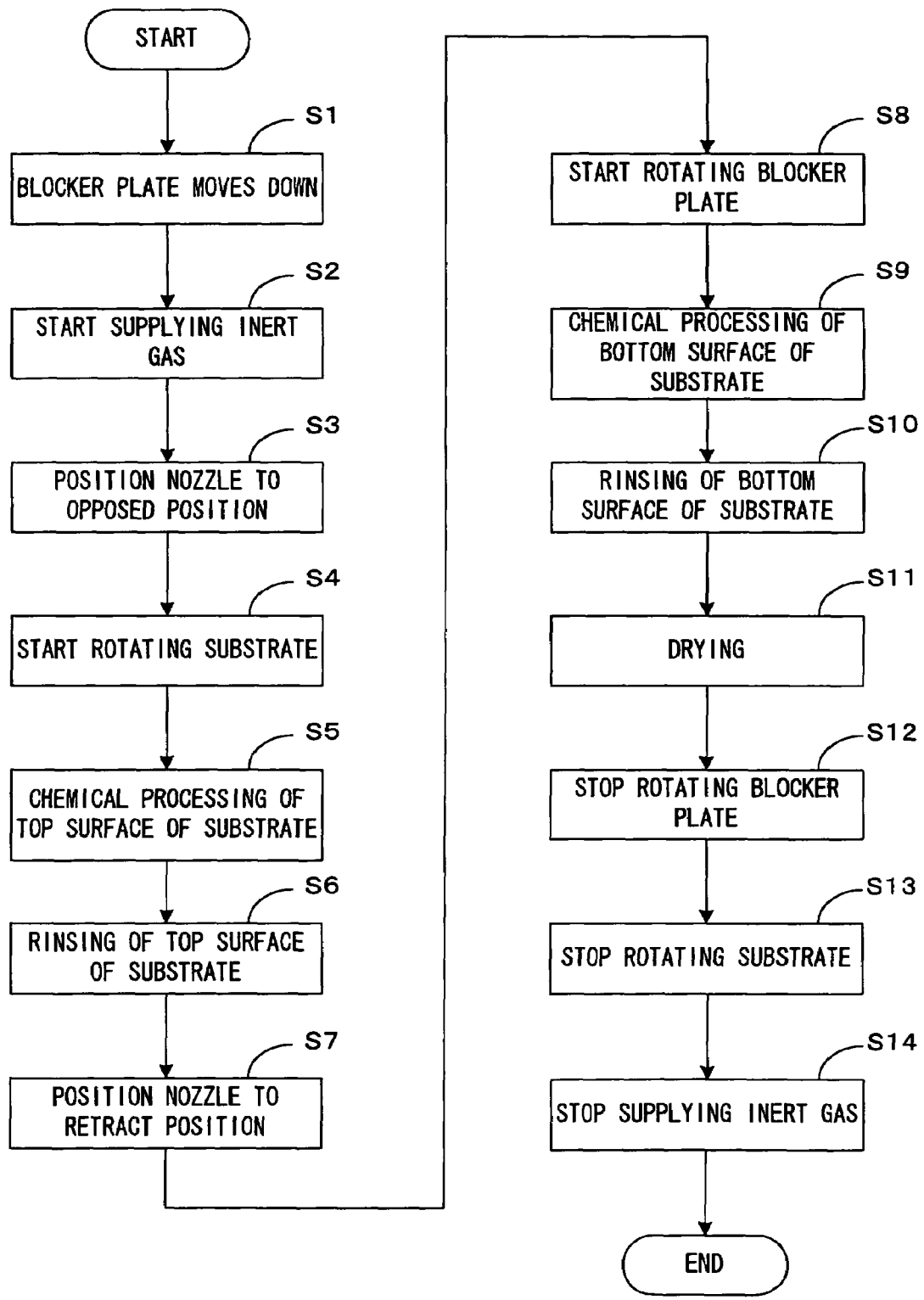
FIG. 9 is a flow chart of the operation of the substrate processing apparatus shown in FIG. 6.

An operation of the substrate processing apparatus having the structure above will now be described with reference to FIG. 9. FIG. 9 is a flow chart of the operation of the substrate processing apparatus shown in FIG. 6. First, a substrate transportation robot not shown transports an unprocessed substrate W to the substrate processing apparatus, and as the substrate W is mounted at its back surface on the supports 7 with the device-seating surface of the substrate W facing up, the controller 80 moves down the atmosphere blocker plate 90 and the atmosphere blocker plate 90 is accordingly located close to the substrate W (Step S1). With the on-off valve 23 open, the inert gas from the gas supplying part 21 is ejected at the gas ejection outlets 9b and 90b which are formed in the opposing surface 9a of the atmosphere blocker plate 90 and the inert gas is supplied toward a central portion of the top surface of the substrate W via the gas supply path 18, whereby the substrate W is pressed against the supports 7 and held at the spin base 5 (Step S2).

Next, the controller 80 activates the nozzle move mechanism 67 and the processing liquid nozzle 6 accordingly is positioned at the opposed position (Step S3). Following this, the controller 80 drives the motor 3 while maintaining the atmosphere blocker plate 90 in a halt, so that the substrate W rotates together with the spin base 5 (Step S4). The on-off valve 16 is then opened, supplying the chemical solution to the top rim portion TR of the substrate W from the processing liquid nozzle 6 (Step S5). In consequence, the chemical solution is uniformly supplied to the entire top rim portion TR of the substrate W over a predetermined width from the end of the substrate W, attaining the chemical processing of the top rim portion TR of the substrate W. After the chemical processing, the controller 80 opens the on-off valve 20 and the rinsing liquid is supplied to the top rim portion TR of the substrate W from the processing liquid nozzle 6 (Step S6). The rinsing liquid thus washes away the chemical solution adhering to the top rim portion TR of the substrate W.

As the chemical processing and rinsing of the top rim portion TR of the substrate W thus complete, the controller 80 activates the nozzle move mechanism 67 and the processing liquid nozzle 6 is positioned at the retract position (Step S7).

While this is followed by processing of the bottom surface of the substrate W, it is preferable that the controller 80 at this stage drives the motor 9m of the block drive mechanism and the atmosphere blocker plate 90 rotates in the same direction and at approximately the same number of revolutions as the spin base 5 (Step S8). This prevents the rotations from creating excessive air flows between the substrate W and the atmosphere blocker plate 90, and prevents the chemical atmosphere from sucking in and the chemical solution from jumping back.

The controller 80 then opens the on-off valve 45, whereby the chemical solution is supplied at the nozzle outlet 41a of the lower clean nozzle 41 toward a central portion of the bottom surface of the substrate W from the chemical solution source 31 (Step S9). Therefore, due to the centrifugal force which is created as the substrate W rotates, the chemical solution supplied to the central portion of the bottom surface of the substrate W spreads throughout the bottom surface of the substrate W, achieving the chemical processing of the entire bottom surface of the substrate W. The chemical processing of the bottom surface of the substrate W may be performed during the chemical processing of the top rim portion TR of the substrate W or may be partially overlapped with the chemical processing of the top rim portion TR of the substrate W. After the chemical processing for a predetermined period of time, while the substrate W still rotates, the controller 80 closes the on-off valve 45, so that the supply of the chemical solution from the chemical solution source 31 is accordingly stopped and the chemical solution is drained off and discharged to outside the substrate.

As the chemical solution is thus drained off, the controller 80 opens the on-off valve 47 for rinsing of the bottom surface of the substrate W (Step S10). The rinsing of the bottom surface of the substrate W as well may be performed during rinsing of the top rim portion TR of the substrate W or may be partially overlapped with rinsing of the top rim portion TR of the substrate W. After the rinsing for a predetermined period of time, the controller 80 closes the on-off valve 47, so that the supply of the rinsing liquid is stopped and the rinsing liquid is drained off and discharged to outside the substrate.

Next, while the inert gas is supplied into the space SP which is created between the top surface of the substrate W and the opposing surface 9a of the atmosphere blocker plate 90, the controller 80 opens the on-off valve 49, thereby introducing the inert gas into the space between the bottom surface of the substrate W and the opposing surface of the spin base 5 at a predetermined flow rate from the gas supply path 48. The motor 3 and the motor 9m then rotate at a high speed, whereby the residual rinsing liquid is spun off and the substrate is dried (Step S11).

As the drying of the substrate W ends, the controller 80 controls the motor 9m, thereby stopping the rotations of the atmosphere blocker plate 90 (Step S12), and the controller 80 controls the motor 3, thereby stopping the rotations of the substrate W (Step S13). The on-off valves 19 and 23 are thereafter closed, the supply of the gas into the space SP is stopped, and the substrate W is accordingly released from pressing and holding (Step S14). The atmosphere blocker plate 90 then moves toward above, and the substrate transportation robot unloads the processed substrate W. This completes the series of chemical processing and rinsing.

As described above, this embodiment does not need a holding member such as a chuck pin which contacts the outer edge of the substrate W and holds the substrate W, and therefore, effectively prevents re-adhering of the processing liquid to the surfaces of the substrate as in the case of the first embodiment. Further, since the processing liquid is supplied from the processing liquid nozzle 6 directly to the top rim portion (top processing area) TR of the substrate W, the following advantages are obtained. That is, as compared with processing of the top rim portion TR of the substrate W with the processing liquid supplied to the bottom surface of the substrate W and circling from the edge surface of the substrate W, it is easier to control the processing width from the edge surface along the diameter direction of the substrate W. Hence, it is possible to control the processing width from the edge surface along the diameter direction of the substrate W freely and at a high accuracy. Even when the substrate W such as a semiconductor wafer has a notch therefore, it is possible to ensure the uniformity of the processing width in the notch.

In this embodiment as well, each support 7 moves away from the bottom surface of the substrate W at least once during processing while supplying the processing liquid to the bottom surface of the substrate W, the processing liquid circles over even to the sections where the supports 7 abut on the bottom surface of the substrate W and the entire bottom surface of the substrate W is processed.

Further, while the chemical solution and the rinsing liquid are supplied at the processing liquid nozzle 6 to the substrate W in this embodiment, different nozzles may be disposed respectively for the chemical solution and the rinsing liquid. Even in this case, the sizes of the nozzles may be the same and the nozzles may be alternately disposed to the side of the atmosphere blocker plate 90, so that the atmosphere blocker plate 90 is formed with a dent 90a provided in one place.

Third Embodiment

Figure 10:
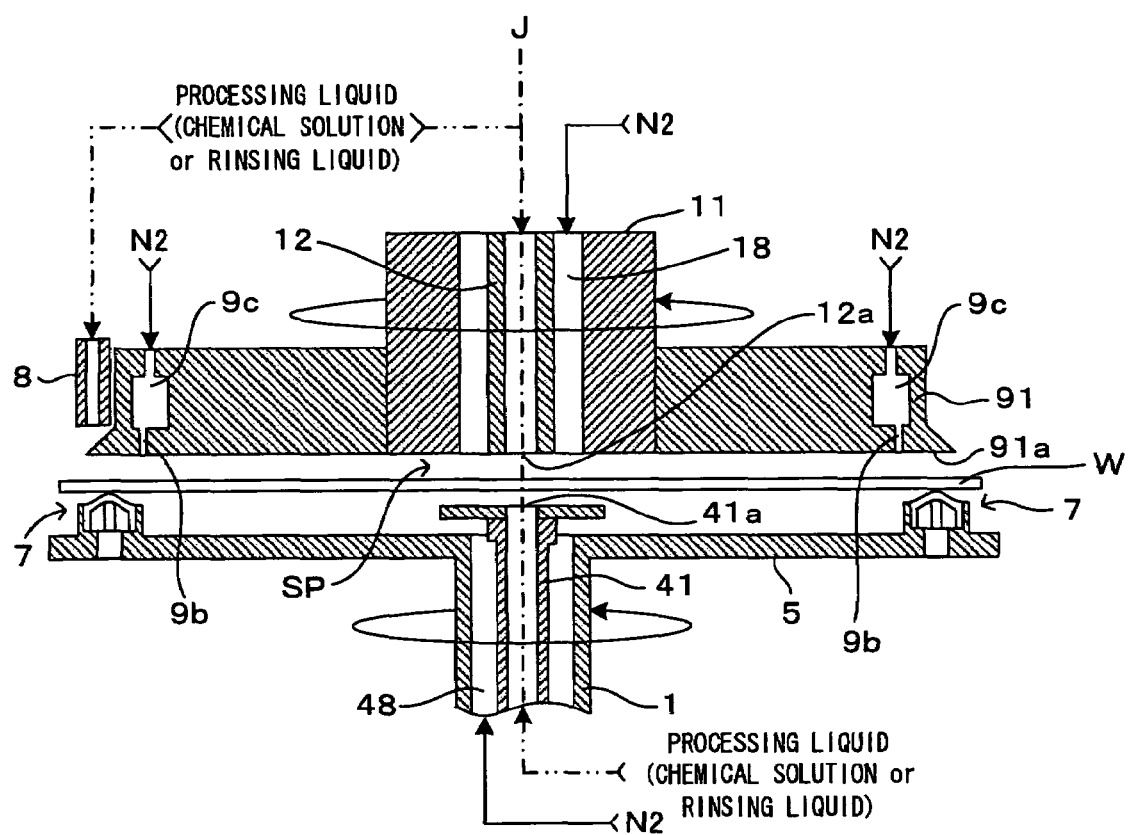
FIG. 10 is a drawing which shows a third embodiment of the substrate processing apparatus according to the present invention.

FIG. 10 is a drawing which shows a third embodiment of the substrate processing apparatus according to the present invention. FIG. 11 is a partial cross sectional view of the substrate processing apparatus shown in FIG. 10. While being similar to the second embodiment in that the processing liquid nozzle is additionally disposed at which the processing liquid is supplied to the top rim portion of the substrate W, the third embodiment is different from the second embodiment in that the atmosphere blocker plate 90 can not rotate while the processing liquid is supplied to the top surface of the substrate W in the second embodiment, the atmosphere blocker plate can rotate in the third embodiment. Except for this difference which requires a partial modification of the structure of the atmosphere blocker plate, the structure according to the third embodiment is basically similar to those according to the first and the second embodiments. Hence, as for a condition for rotating the substrate W while pressing the substrate W against the supports 7 and holding the substrate W at the spin base 5, when the parameter range described in relation to the first embodiment are met, stable processing is realized without causing slipping of the substrate W. In the following, the same structures will be denoted at the same reference symbols but will not be described, and the characteristics of the third embodiment will be described with a primary focus on differences.

In the third embodiment, the atmosphere blocker plate 91 comprises an opposing surface 91a which is circular and smaller than the plan size of the substrate W. Hence, when the opposing surface 91a is faced parallel against the top surface of the substrate W, the top rim portion of the substrate W is exposed without getting covered with the opposing surface 91a. The atmosphere blocker plate 91 has a shape which is obtained by uniting a lower part which is in a form of a circular truncated cone whose bottom surface is the opposing surface 91a and whose horizontal cross section is progressively smaller toward above and an upper part which is in a form of a circular cylinder whose horizontal cross section is the top surface of the circular truncated cone. To be more specific, a bottom rim portion of the atmosphere blocker plate 91 is a slant 91b which is inclined closer to the vertical axis J toward above at the entire circumference. The top rim of the atmosphere blocker plate 91, namely, the section over the slant 91b is a side surface 91c which is approximately upright.

A processing liquid nozzle 8 is capable of selectively supplying at the bottom end the chemical solution or the rinsing liquid. Further, the processing liquid nozzle 8 is connected to a nozzle move mechanism not shown, and therefore, when driven by the nozzle move mechanism, the processing liquid nozzle 8 is positioned either to a close position (the position shown in FIG. 11) which is close to the side surface 91c of the atmosphere blocker plate 91 or to a retract position which is off to the side (or to above) from the atmosphere blocker plate 91. The processing liquid nozzle 8 is shaped like a cylindrical column elongating vertically for instance so that a side surface of the processing liquid nozzle 8 is parallel to the side surface 91c of the atmosphere blocker plate 91. Hence, when the nozzle 8 is positioned at the close position, it is possible to eject the processing liquid toward the slant 91b.

While the opposing surface 91a of the atmosphere blocker plate 91 is a hydrophobic surface which exhibits a hydrophobic property, the slant 91b is a hydrophilic surface which exhibits a hydrophilic property. Therefore, the processing liquid supplied to the slant 91b flows down along the slant 91b. The processing liquid reaching the bottom end of the slant 91b flows down to the top rim portion of the substrate W without circulating onto the opposing surface 91a which is a hydrophobic surface. To be more specific, the processing liquid flowing down from the atmosphere blocker plate 91 is supplied to the top processing area TR which is on the outer side relative to the cross-line with the top surface of the substrate W which is defined when the slant 91b is extended toward the substrate W, flows toward the rim of the substrate W under the centrifugal force which is created as the substrate W rotates, and flows down along the edge surface of the substrate W. Hence, as the substrate W rotates while the processing liquid is ejected at the processing liquid nozzle 8, the top rim portion of the substrate W is processed uniformly at the entire circumference.

Figure 12:
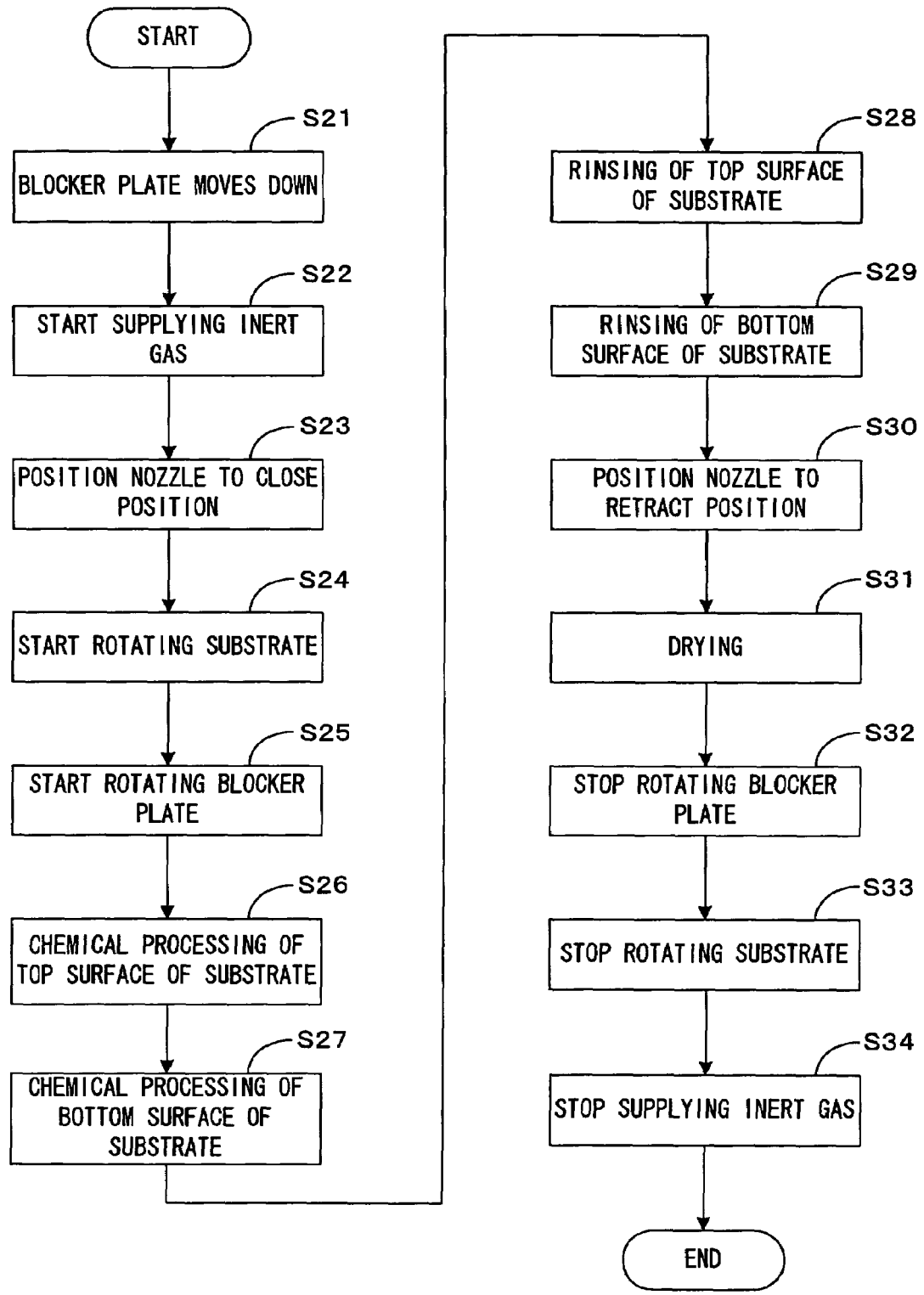
FIG. 12 is a flow chart of the operation of the substrate processing apparatus shown in FIG. 10.

An operation of the substrate processing apparatus having the structure above will now be described with reference to FIG. 12. FIG. 12 is a flow chart of the operation of the substrate processing apparatus shown in FIG. 10. As the substrate W is mounted at its back surface on the supports 7 with the device-seating surface of the substrate W facing up, the controller 80 moves down the atmosphere blocker plate 91 and the atmosphere blocker plate 91 is accordingly located close to the substrate W (Step S21). The inert gas is ejected at the plurality of gas ejection outlets 9b and the inert gas is supplied toward a central portion of the top surface of the substrate W via the gas supply path 18, whereby the substrate W is pressed against the supports 7 and held at the spin base 5 (Step S22).

Next, the controller 80 activates the nozzle move mechanism and the processing liquid nozzle 8 accordingly is positioned at the close position which is close to the side surface 91c of the atmosphere blocker plate 91 (Step S23). Following this, the motor 3 is driven and the substrate W rotates (Step S24), and the motor 9m of the block drive mechanism is driven and the atmosphere blocker plate 91 rotates about the vertical axis J in the same direction at the approximately same number of revolutions as the spin base 5 (Step S25). The chemical solution is then supplied at the processing liquid nozzle 8 to the slant 91b of the atmosphere blocker plate 91. Thus supplied chemical solution flows down the slant 91b and reaches the top rim portion TR of the rotating substrate W, which attains uniform chemical processing all around the circumference of the substrate W over a predetermined width from the end of the substrate W (Step S26).

The chemical solution will not circle over to the opposing surface 91a since the opposing surface 91a of the atmosphere blocker plate 91 is a hydrophobic surface, and the chemical atmosphere will not enter the non-processing area NTR in a central portion of the top surface since the inert gas supplied into the space SP which is created between the atmosphere blocker plate 91 and the top surface of the substrate W flows out along the diameter direction. Further, as the substrate W and the atmosphere blocker plate 91 rotate in synchronization, creation of excessive air flows is prevented, which prevent the chemical solution from entering the non-processing area NTR owing to sucking in or jumping of the chemical atmosphere around the substrate.

The chemical solution is then supplied also at the lower clean nozzle 41 simultaneously with or after the supply of the chemical solution to the top surface of the substrate W, thus achieving the chemical processing of the entire bottom surface of the substrate W (Step S27). After the chemical processing of the top rim portion TR and the bottom surface of the substrate W for a predetermined period of time, the supply of the chemical solution is stopped, and the chemical solution is drained off and discharged to outside the substrate. After draining off of the chemical solution, the rinsing liquid is supplied at the processing liquid nozzle 8 to the top rim portion of the substrate W (Step S28). The rinsing liquid thus washes away the chemical solution adhering to the top rim portion TR of the substrate W. Alternatively, the rinsing liquid may be supplied also at the lower clean nozzle 41 simultaneously with or after the supply of the rinsing liquid to the top surface of the substrate W to thereby rinse the entire bottom surface of the substrate W (Step S29).

After the rinsing liquid is supplied to the top rim portion TR of the substrate W, the controller 80 drives the nozzle move mechanism and the processing liquid nozzle 8 is accordingly positioned to the retract position (Step S30). Following this, the controller 80 allows supply of the inert gas into the space SP which is created between the top surface of the substrate W and the opposing surface 9a of the atmosphere blocker plate 91, and opens the on-off valve 49, thereby introducing the inert gas into the space between the bottom surface of the substrate W and the opposing surface of the spin base 5 at a predetermined flow rate from the gas supply path 48. The motor 3 and the motor 9m of the block drive mechanism then rotate at a high speed, so that the liquid components adhering to the substrate W and the atmosphere blocker plate 91 are drained off owing to the centrifugal force and the substrate W and the atmosphere blocker plate 91 are dried (Step S31).

After the drying of the substrate W ends, the controller 80 controls the motor 9m, thereby stopping the rotations of the atmosphere blocker plate 91 (Step S32), and the controller 80 controls the motor 3, thereby stopping the rotations of the substrate W (Step S33). The on-off valves 19 and 23 are thereafter closed, the supply of the gas into the space SP is stopped, and the substrate W is accordingly released from pressing and holding (Step S34). The atmosphere blocker plate 91 then moves toward above, and the processed substrate W is unloaded.

As described above, this embodiment does not need a holding member such as a chuck pin which contacts the outer edge of the substrate W and holds the substrate W, and therefore, effectively prevents re-adhering of the processing liquid to the surface of the substrate as in the case of the earlier embodiments. Further, since the processing liquid supplied at the processing liquid nozzle 8 and flowing down the slant 91*b* of the atmosphere blocker plate 91 is supplied to the top rim portion (top processing area) TR of the substrate W, the processing width is uniform all around the circumference of the substrate W. That is, the processing liquid flows down the slant 91*b* of the atmosphere blocker plate 91 which is a hydrophilic surface and covers a certain range from the edge surface of the substrate W but will not circle over onto the opposing surface 91*a* which is a hydrophobic surface, the processing width will not vary. Further, since the processing liquid can be supplied to the top rim portion TR of the substrate W while the substrate W as well as the atmosphere blocker plate 91 rotate, it is possible to effectively prevent sucking in or jumping of the processing liquid back onto the central portion of the top surface (the non-processing area NTR).

The invention is not limited to the embodiments described above but may be modified in various manners in addition to the embodiments above, to the extent not deviating from the object of the invention. For instance, although the embodiments described above are directed to the application of the invention to a substrate processing apparatus which cleans the bottom surface, the edge surface and the top rim portion of the substrate W, this is not limiting. For example, the invention is generally applicable to any substrate processing apparatus which performs processing such as cleaning, etching and developing to both the top and the bottom surfaces of a substrate or only one of the both surfaces while rotating the substrate W.

Further, although the supports 7 are formed in the protrusions 5*a* which are obtained by locally protruding the rim portion of the spin base 5 toward above in the embodiments described above, instead of protruding local sections of the spin base 5 toward above, the supports 7 themselves may be protruded toward above from the top surface of the spin base 5. Alternatively, the supports 7 may be buried inside the top surface of the spin base 5 without protruding local sections of the spin base 5 toward above and only the film members 71 may be protruded toward above from the top surface of the spin base 5.

Further, although the gas ejection outlets 9*b* are formed in the opposing surface 9*a* of the atmosphere blocker plate 9 or 90 so as to vertically eject the inert gas on the rotation track Ta of the supports 7 in the embodiments described above, this is not limiting. For example, the gas ejection outlets 9*b* may be formed on the inner side relative to the rotation track Ta of the supports 7 and the inert gas may accordingly be ejected downward and outward onto the rotation track Ta of the supports 7.

Figure 13A:
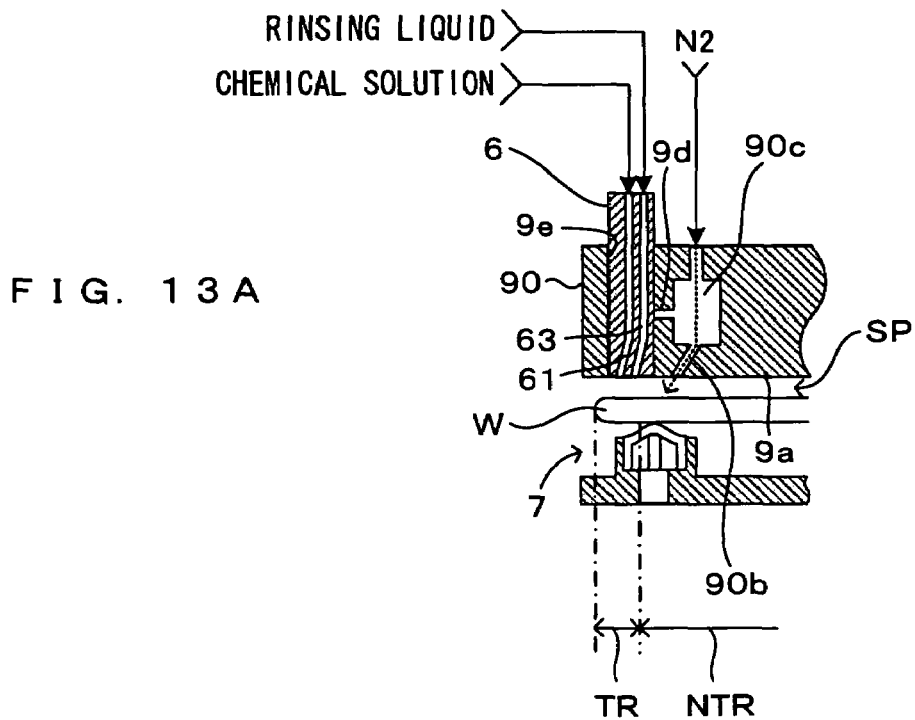
FIGS. 13A and 13B are partial cross sectional views of a modified embodiment of the substrate processing apparatus shown in FIG. 6.
Figure 13B:
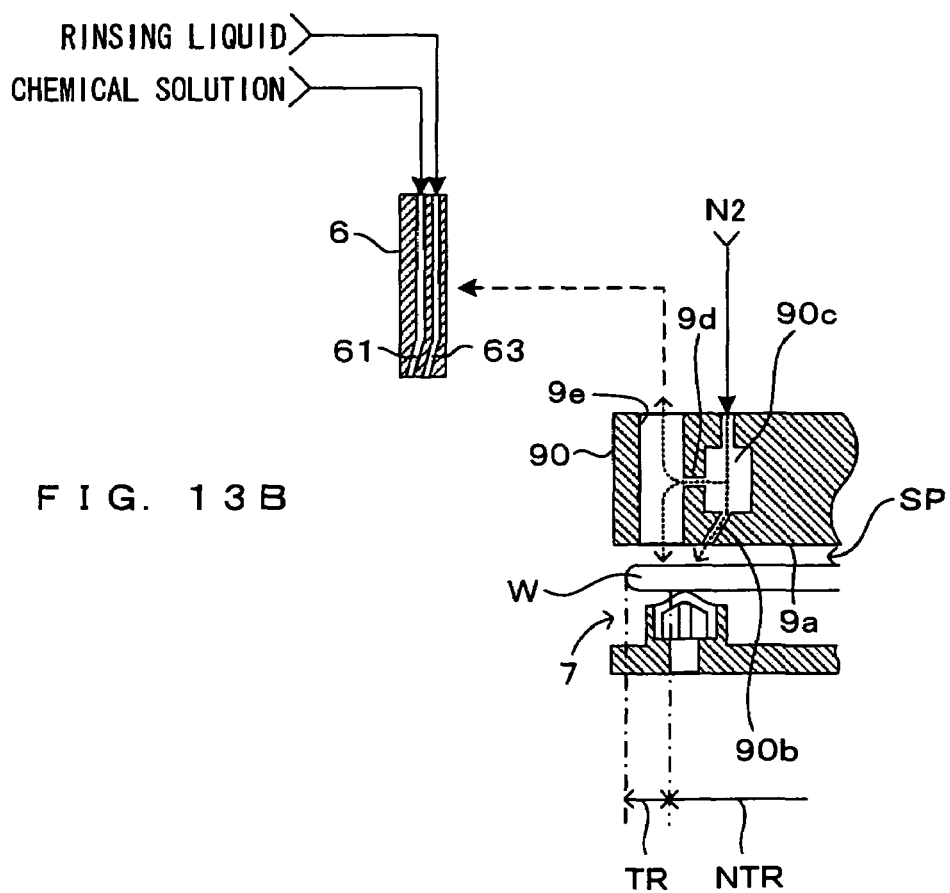

Further, although the processing liquid nozzle 6 slides into the dent 90*a* which is at the rim of the atmosphere blocker plate 90 and is positioned facing the top rim portion (top processing area) TR of the substrate W in the second embodiment described earlier, this is not limiting. For example, as shown in FIGS. 13A and 13B, a through hole 9*e* which is open vertically and accepts the processing liquid nozzle 6 may be formed in the rim portion of the atmosphere blocker plate 90 and the processing liquid nozzle 6 may be inserted in the through hole 9*e* until the bottom end of the processing liquid nozzle 6 becomes flush with the opposing surface 9*a* to thereby position the processing liquid nozzle 6 facing the top rim portion TR (FIG. 13A). In addition, when a gas introduction inlet 9*d* communicating with the gas distributing space 90*c* is formed in the inner wall of the through hole 9*e*, as the processing liquid nozzle 6 retracts out from the through hole 9*e*, the inert gas gets ejected out through both the top and the bottom openings of the through hole 9*e* (FIG. 13B).

In this structure, as the nozzle 6 retracts out from the through hole 9*e*, the atmosphere blocker plate 90 rotates together with the substrate W. It is therefore possible to drain off the processing liquid adhering to the atmosphere blocker plate 90 and prevent rotation-induced creation of excessive air flows between the substrate W and the atmosphere blocker plate 90. This prevents sucking in of the chemical atmosphere or jumping of the chemical solution back into the space SP which is between the substrate W and the atmosphere blocker plate 90.

Further, since the processing liquid nozzle 6 is in the through hole 9*e* while the processing liquid is supplied, even if the processing liquid splashes back toward the processing liquid nozzle 6 during processing of the substrate, the opposing surface 9*a* of the atmosphere blocker plate 90 blocks the processing liquid, preventing a large amount of the processing liquid from adhering to the nozzle 6. Hence, the processing liquid will not drop down from the nozzle 6 or adhere to the substrate W or portions around the substrate W as the nozzle moves, which prevents the processing liquid from exerting an adverse influence. The nozzle 6 therefore does not have to be cleaned, which improves the throughput of the apparatus.

Further, since the inert gas is ejected through both the top and the bottom openings of the through hole 9*e* even when the nozzle 6 retracts away from the atmosphere blocker plate 90 in this embodiment, the processing liquid will not enter the through hole 9*e* or jump back onto the substrate W. It is thus possible to prevent corrosion of the device-seating surface which is in the central portion of the top surface (the non-processing area NTR) of the substrate W.

The present invention is applicable to a substrate processing apparatus which performs processing such as cleaning to the surfaces of substrates in general including semiconductor wafers, glass substrates for photomask, glass substrates for liquid crystal display, glass substrates for plasma display and optical disk substrates.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus which performs predetermined processing by supplying a processing liquid to a substrate while rotating said substrate, comprising:
   a rotary member which has a vertical axis and is structured to rotate freely about the vertical axis;
   a rotating element which rotates said rotary member;
   a support element which is disposed upward to said rotary member and which comprises at least three supporting members disposed so as to abut on a bottom surface of said substrate at positions inward from an edge of said substrate to thereby support said substrate with a distance from said rotary member; and
   a pressing element which presses said substrate against said supporting members by supplying gas to a top surface of said substrate and accordingly makes said rotary member hold said substrate; wherein
   said pressing element is arranged to control a press-holding condition to cause a friction force developing between the bottom surface of said substrate and said supporting members to be greater than a centrifugal force acting upon said substrate, wherein the friction force increases in response to an increased flow rate of gas supplied by said pressing element, and wherein the centrifugal force increases in response to an increased speed of rotation of said rotary member rotated by said rotating element.

2. The substrate processing apparatus of claim 1, further comprising a driver which applies drive force to said support element, wherein
said support element comprises, as said supporting members, at least four movable members which are structured to freely move away from and abut on the bottom surface of said substrate,
said processing is executed by supplying said processing liquid to the bottom surface of said substrate while said movable members of at least three abut on the bottom surface of said substrate to support said substrate under the drive force from said driver, and
said driver makes each one of said movable members move away from the bottom surface of said substrate at least once during said processing.

3. The substrate processing apparatus of claim 1, further comprising a bottom-side processing liquid supplier which supplies said processing liquid toward the bottom surface of said substrate which rotates as it is pressed against said supporting members, wherein
said pressing element supplies gas to a non-processing area which is on an inner side relative to a top processing area which is processed with said processing liquid supplied by said bottom-side processing liquid supplier to the bottom surface of said substrate and circling over to a rim portion of the top surface of said substrate, and
said supporting members abut on the bottom surface of said substrate corresponding to said non-processing area and accordingly support said substrate.

4. The substrate processing apparatus of claim 1, further comprising a top-side processing liquid supplier which supplies said processing liquid to a rim portion of the top surface of said substrate which rotates as it is pressed against said supporting members.

5. The substrate processing apparatus of claim 1, wherein
said pressing element includes a plate member that has a vertical axis which is coaxial with the vertical axis of said rotary member and an opposing surface which opposes against the top surface of said substrate in which a plurality of gas ejection outlets are formed, and
said plurality of gas ejection outlets are arranged along a circumference about the vertical axis of said plate member.

6. The substrate processing apparatus of claim 5, wherein
said pressing element includes a gas supplying part which guides and supplies gas to a space which is created between said opposing surface and the top surface of said substrate by ejecting gas at said plurality of gas ejection outlets.

7. The substrate processing apparatus of claim 6, wherein
said plurality of gas ejection outlets in said opposing surface are formed on a rotation track of said supporting members and eject gas in a substantially vertical direction, thereby pressing said substrate against said supporting members.

8. The substrate processing apparatus of claim 6, wherein
said plate member is structured to be able to rotate about said vertical axis thereof, and
said rotating element rotates said plate member together with said substrate while said pressing element makes said rotary member hold said substrate.

9. A substrate processing method in which predetermined processing is performed by supplying a processing liquid to a substrate while rotating said substrate, said method comprising steps of:
making at least three supporting members which are disposed upward to a rotary member abut on a bottom surface of said substrate at positions inward from an edge of said substrate to thereby support said substrate with a distance from said rotary member;
pressing said substrate against said supporting members by supplying gas to a top surface of said substrate and accordingly makes said rotary member hold said substrate;
rotating said rotary member about a vertical axis to thereby rotate said substrate; and
controlling a press-holding condition to cause a friction force developing between the bottom surface of said substrate and said supporting members to be greater than a centrifugal force acting upon said substrate, the friction force being increased by increasing a flow rate of gas supplied to the top surface of said substrate, the centrifugal force being increased by increasing a speed of rotation of said rotary member.

10. A substrate processing apparatus which performs predetermined processing by supplying a processing liquid to a substrate while rotating said substrate, comprising:
a rotary member which is structured to rotate freely about a vertical axis;
a rotating element which rotates said rotary member;
a support element which is disposed upward to said rotary member and which comprises at least three supporting members which abut on a bottom surface of said substrate to thereby support said substrate with a distance from said rotary member;
a pressing element which presses said substrate against said supporting members by supplying gas to a top surface of said substrate and accordingly makes said rotary member hold said substrate;
a bottom-side processing liquid supplier which supplies said processing liquid toward the bottom surface of said substrate which rotates as it is pressed against said supporting members, wherein
said pressing element supplies gas to a non-processing area which is on an inner side relative to a top processing area which is processed with said processing liquid supplied by said bottom-side processing liquid supplier to the bottom surface of said substrate and circling over the rim portion of the top surface of said substrate,
said supporting members abut on the bottom surface of said substrate corresponding to said non-processing area and accordingly support said substrate, and
said pressing element is arranged to control a press-holding condition in which said substrate is rotated while being maintained pressed against said supporting members without slipping on said supporting members.

11. The substrate processing apparatus of claim 10, wherein
said pressing element comprises:
a plate member which has an opposing surface which opposes against the top surface of said substrate and in which a gas ejection outlet is formed, and
a gas supplying part which guides and supplies gas to a space which is created between said opposing surface and the top surface of said substrate by ejecting gas at the gas ejection outlet.

12. The substrate processing apparatus of claim 11, wherein said gas ejection outlet in said opposing surface is formed on a rotation track of said supporting members and ejects gas in a substantially vertical direction, thereby pressing said substrate against said supporting members.

13. The substrate processing apparatus of claim 11, wherein said plate member is structured to be able to rotate about said vertical axis, and said rotating element rotates said plate member together with said substrate while said pressing element makes said rotary member hold said substrate.

14. The substrate processing apparatus of claim 10, further comprising a driver which applies drive force to said support element, wherein said support element comprises, as said supporting members, at least four movable members which are structured to freely move away from and abut on the bottom surface of said substrate, said processing is executed by supplying said processing liquid to the bottom surface of said substrate while said movable members of at least three abut on the bottom surface of said substrate to support said substrate under the drive force from said driver, and said driver makes each one of said movable members move away from the bottom surface of said substrate at least once during said processing.

15. The substrate processing apparatus of claim 10, further comprising a top-side processing liquid supplier which supplies said processing liquid to a rim portion of the top surface of said substrate which rotates as it is pressed against said supporting members.

* * * * *

UNITED STATES PATENT AND TRADEMARK OFFICE
CERTIFICATE OF CORRECTION

PATENT NO.       : 7,608,152 B2  Page 1 of 1
APPLICATION NO. : 11/130585
DATED            : October 27, 2009
INVENTOR(S)      : Miya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1195 days.

Signed and Sealed this

Twelfth Day of October, 2010

David J. Kappos
*Director of the United States Patent and Trademark Office*